US011469313B2

(12) United States Patent
Yilmaz et al.

(10) Patent No.: US 11,469,313 B2
(45) Date of Patent: Oct. 11, 2022

(54) SELF-ALIGNED TRENCH MOSFET AND IGBT STRUCTURES AND METHODS OF FABRICATION

(71) Applicant: IPOWER SEMICONDUCTOR, Gilroy, CA (US)

(72) Inventors: Hamza Yilmaz, Gilroy, CA (US); Jong Oh Kim, Portland, OR (US)

(73) Assignee: IPOWER SEMICONDUCTOR, Gilroy, CA (US)

( * ) Notice: Subject to any disclaimer, the term of this patent is extended or adjusted under 35 U.S.C. 154(b) by 0 days.

(21) Appl. No.: 17/152,767

(22) Filed: Jan. 19, 2021

(65) Prior Publication Data
US 2021/0226041 A1    Jul. 22, 2021

Related U.S. Application Data

(60) Provisional application No. 62/962,161, filed on Jan. 16, 2020.

(51) Int. Cl.
| | |
|---|---|
| *H01L 29/66* | (2006.01) |
| *H01L 29/40* | (2006.01) |
| *H01L 29/417* | (2006.01) |
| *H01L 29/78* | (2006.01) |
| *H01L 21/768* | (2006.01) |
| *H01L 21/28* | (2006.01) |

(52) U.S. Cl.
CPC .. *H01L 29/66734* (2013.01); *H01L 21/28247* (2013.01); *H01L 21/76834* (2013.01); *H01L 29/401* (2013.01); *H01L 29/407* (2013.01); *H01L 29/41766* (2013.01); *H01L 29/7813* (2013.01)

(58) Field of Classification Search
CPC ............ H01L 29/402; H01L 29/66734; H01L 29/407; H01L 29/41766; H01L 29/7813; H01L 21/28247; H01L 21/76834; H01L 21/76829; H01L 21/02362
See application file for complete search history.

(56) References Cited

U.S. PATENT DOCUMENTS

| | | | |
|---|---|---|---|
| 5,219,777 A | 6/1993 | Kang | |
| 8,816,431 B2 | 8/2014 | Bowers | |
| 8,847,310 B1 | 9/2014 | Korec | |
| 9,224,853 B2 | 12/2015 | Pan | |
| 9,812,535 B1 * | 11/2017 | Haase | ................... H01L 29/513 |
| 10,056,461 B2 | 8/2018 | Lui et al. | |
| 10,777,661 B2 | 9/2020 | Yilmaz | |

(Continued)

FOREIGN PATENT DOCUMENTS

| | | |
|---|---|---|
| WO | 2019169361 A1 | 9/2019 |
| WO | 2020180338 A1 | 9/2020 |

OTHER PUBLICATIONS

PCT, International Search Report and Written Opinion of the International Searching Authority for International Application No. PCT/US2019/020441, dated May 23, 2019, 8 pages.

(Continued)

*Primary Examiner* — Joseph C. Nicely
(74) *Attorney, Agent, or Firm* — Halit N. Yakupoglu

(57) ABSTRACT

A self-aligned p+ contact MOSFET device is provided. A process to manufacture the device includes forming oxide plugs on top of gate trenches, conducting uniform silicon mesa etch back, and forming oxide spacers to form contact trenches.

14 Claims, 21 Drawing Sheets

(56) References Cited

U.S. PATENT DOCUMENTS

| | | |
|---|---|---|
| 10,998,438 B2 | 5/2021 | Yilmaz |
| 2002/0036319 A1 | 3/2002 | Baliga |
| 2006/0267090 A1* | 11/2006 | Sapp .................. H01L 29/7811 257/E21.345 |
| 2009/0096018 A1 | 4/2009 | Izumi |
| 2010/0190307 A1 | 7/2010 | Lee et al. |
| 2011/0254088 A1 | 10/2011 | Darwish et al. |
| 2012/0248530 A1 | 10/2012 | Lui et al. |
| 2016/0104788 A1* | 4/2016 | Ryu .................. H01L 29/66545 438/586 |
| 2016/0126348 A1 | 5/2016 | Deng et al. |
| 2016/0172482 A1* | 6/2016 | Bobde ............... H01L 29/42356 438/270 |
| 2016/0351688 A1* | 12/2016 | Kameyama ......... H01L 29/1095 |
| 2017/0330964 A1 | 11/2017 | Siemieniec et al. |
| 2019/0273152 A1 | 9/2019 | Yilmaz |
| 2019/0273157 A1 | 9/2019 | Yilmaz |
| 2020/0044078 A1 | 2/2020 | Yilmaz et al. |

OTHER PUBLICATIONS

PCT, International Search Report and Written Opinion of the International Searching Authority for International Application No. PCT/US2019/032757, dated Aug. 16, 2019, 9 pages.

\* cited by examiner

SELF-ALIGNED TRENCH MOSFET AND IGBT STRUCTURES AND METHODS OF FABRICATION

CROSS REFERENCE TO RELATED APPLICATION

This application is related to and claims priority to U.S. Provisional Application No. 62/962,161, filed on Jan. 16, 2020, which is incorporated herein in its entirety.

BACKGROUND

Field of the Invention

The present invention relates to semiconductor devices, more particularly, to device structures and methods of forming trench metal oxide semiconductor field effect transistor (MOSFET) as part of Power MOSFET or Insulated Gate Bipolar Transistor (IGBT) devices.

Description of the Related Art

In power metal oxide semiconductor field effect transistor (MOSFET) devices, as the resistance per square area is kept decreasing due to the availability of new structures, advanced process techniques and tools, die sizes for MOSFET products are also getting smaller and smaller. There are several challenges to be addressed in advanced trench MOSFET products with smaller die sizes, for example: (1) increasing thermal resistance of the smaller die, (2) increasing robustness of the MOSFETs to handle much higher current density under unclamped inductive, high dv/dt and diode recovery mode of operations compared to low performing larger die area type power MOSFETs, and (3) minimizing Rds and Cgd variations due to large variation of Inter Poly Oxide (IPO) thickness.

Manufacturing thinner dies and improved power device packaging can address the thermal resistance related issues in power MOSFET devices. Improving the robustness of power MOSFET devices in smaller dies includes, for example, (1) providing structures and processes to localize breakdown in the middle of the MOSFET body, (2) ensuring device avalanche breakdown to occur in the active device cells (MOSFETs) rather than the termination areas, (3) keeping extremely low p body to source shorting resistance to prevent turn on of parasitic NPN bipolar transistor of the MOSFET. Mask misalignment of a non-self-aligned p body contact to trench causes an increased shorting resistance between the p body and the n+ source of the MOSFET. Therefore, there is a need for new processes to form p+ body contact structures to minimize the adverse effect of the non-self-aligned p body contacts. Insulated Gate Bipolar Transistors can also benefit from having self-aligned p+ contact to have more uniform threshold voltage distribution and more robust IGBT.

SUMMARY

An aspect of the present invention provides a method of forming shielded gate trench MOSFET devices, including: providing a silicon layer having n type conductivity layer overlying a semiconductor substrate; forming, on a mesa surface of the silicon layer, a plurality of gate trenches in an active region, the gate trenches extending orthogonally from the mesa surface toward the semiconductor substrate; forming in each gate trench a gate trench stack including: a shield layer lining side walls and bottom wall of each gate trench, wherein the shield layer is silicon oxide; forming a first doped poly silicon layer on a portion of the shield layer lining the bottom wall and lower portions of the side walls of the gate trench; forming an inter poly oxide (IPO) layer, on top of the first doped poly silicon layer, having a predefined thickness; growing a gate oxide and forming a second doped poly silicon layer on the IPO layer; etching back top surface of the second doped poly silicon layer to lower the top surface, within the gate trench, below the mesa surface; forming oxide plugs on top surface of the second doped poly silicon inside the trench; etching down the mesa surface to make the mesa surface substantially coplanar with the top surface of the second doped polysilicon layer; forming p body and n+ source regions of the MOSFET in the mesa surface; forming silicon dioxide spacers defining the self-aligned p+ contact trench; and filling the self-aligned p+ contact trench with a metal plug.

Another aspect of the present invention provides a method of forming trench MOSFET devices, including: providing a silicon layer having n type conductivity layer overlying a semiconductor substrate; forming, on a mesa surface of the silicon layer, a plurality of gate trenches in an active region, the gate trenches extending orthogonally from the mesa surface toward the semiconductor substrate; forming in each gate trench a gate trench stack including: growing a gate oxide and forming a doped poly silicon layer on the gate oxide layer; etching back top surface of the doped poly silicon layer to lower the top surface, within the gate trench, below the mesa surface; forming oxide plug on top surface of the doped poly silicon inside the trench; etching down the mesa surface to make the mesa surface substantially coplanar with the top surface of the second doped polysilicon layer; forming p body and n+ source regions of the MOSFET in the mesa surface; forming silicon dioxide spacers defining the self-aligned p+ contact trench; and filling the self-aligned p+ contact trench with a metal plug.

Another aspect of the present invention provides a method of forming shielded gate trench MOSFET devices, including: providing a silicon layer having n type conductivity overlying a semiconductor substrate; forming, on a mesa surface of the silicon layer, a plurality of gate trenches in an active region, the gate trenches extending orthogonally from the mesa surface toward the semiconductor substrate; forming in each gate trench a gate trench stack including: forming a shield layer lining side walls and bottom wall of each gate trench, wherein the shield layer is silicon oxide; forming a first doped poly silicon layer on a portion of the shield layer lining the bottom wall and lower portions of the side walls of the gate trench; removing upper portions of the shield layer to expose upper portions of the side walls; forming an Inter Poly Oxide (IPO) layer on the first doped poly silicon layer by filling the trench with dielectric, planarizing and etching back to predefined thickness; growing gate oxide, depositing and planarizing a second doped poly silicon; etching back the second doped poly silicon below the mesa surface; forming an oxide plug to fill in the upper portion of the second doped poly silicon layer inside the trench by deposition of oxide, planarizing and leaving a thin layer oxide on the silicon mesa and also exposed surface portions of the first doped poly silicon layer; etching down oxide from the mesa surfaces by using an active area mask; etching down the mesa surface; forming silicon dioxide spacer to widen oxide plugs laterally after ion implantation of boron for p body and of arsenic implant for n+ source; forming p+ contact trenches by etching the front surface of the silicon layer utilizing widened oxide plugs as a self-aligned mask;

forming metal plug contacting n+ source and the p base by deposition of Ti and W and CMP of W; forming an Interlayer Dielectric by deposition of oxide and BPSG or PSG; and forming gate, first poly silicon layer and second polysilicon layer contact windows before metallization.

Another aspect of the present invention provides a method of forming shielded gate trench MOS devices, including: providing a silicon layer having a first type conductivity overlying a semiconductor substrate; forming, on a mesa surface of the silicon layer, a plurality of gate trenches in an active region, the gate trenches extending orthogonally from the mesa surface toward the semiconductor substrate; forming in each gate trench a gate trench stack including: forming a shield layer lining side walls and bottom wall of each gate trench, wherein shield layer is silicon oxide; forming a first doped poly silicon layer on a portion of the shield layer lining the bottom wall and lower portions of the side walls of the gate trench; removing upper portions of the shield layer to expose upper portions of the side walls; forming an inter poly oxide (IPO) layer including a thermally grown oxide over first poly silicon, wherein forming of the IPO layer results in forming silicon oxide layer on upper portions of the side walls; depositing a high density plasma (HDP) oxide layer on the oxide layer to further thicken IPO layer, wherein a thickness ratio of the HDP oxide layer on the side walls to on the IPO layer is about 1/5; removing the HDP oxide and the silicon oxide from the trench side walls using wet etching while retaining the HDP oxide over the IPO layer and major portions of the HDP oxide layer on the mesa surface; growing a gate oxide layer on the upper portions of the side walls and forming a second doped poly silicon layer or gate poly Si, on the gate oxide layer and the IPO layer, filling the gate trench; recessing the second doped poly silicon about 0.2-0.5 micron below the mesa surface; forming oxide plugs by depositing oxide on top surface of the second doped poly silicon, which is recessed, in the gate trench and planarizing the oxide by using chemical mechanical polishing (CMP); etching back the remaining oxide after CMP until the silicon mesa exposed, leaving oxide plug on top of the gate poly silicon by using an active area mask to protect the first doped poly silicon layer exposure at the first doped poly silicon layer regions where contact to source metal occurs; utilizing oxide plugs as a self-aligned mask to etch down silicon mesa 0.2 to 0.5 micron below the mesa surface of the silicon layer; forming p body regions and n+ source regions extending between the gate trenches; forming oxide spacers by depositing and reactive ion etching (RIE) of the oxide to widen oxide plugs laterally to narrow down silicon mesa; forming p+ body contact trenches self-aligned to gate trenches by RIE etching of the silicon mesa 0.2-0.5 micron below the silicon mesa surface; forming p+ body contact regions by ion implantation; forming W plugs by sputter deposing Ti/TiN and CVD deposition of W and CMP W and then etching of Ti/TiN; depositing oxide and BPSG layer; and opening source, p body, first poly Si and gate contacts by oxide/BPSG etching.

DETAILED DESCRIPTION

There are different processes to manufacture self-aligned p+ contact MOSFET devices in the prior art, such as (1) using silicon spacer approach to define p+ trench contact region, (2) forming T-shaped trenches, oxide filled T-portion of the trench, and (3) various approaches utilizing single mask for gate trench and p+ contact trench.

The embodiments of the present invention described below may be used to form self-aligned MOSFET devices, such as shielded gate trench MOSFET devices and trench MOSFET devices, and also for self-aligned IGBT devices such as shielded gate trench IGBT devices and trench IGBT devices, as described below.

Figure 1A:
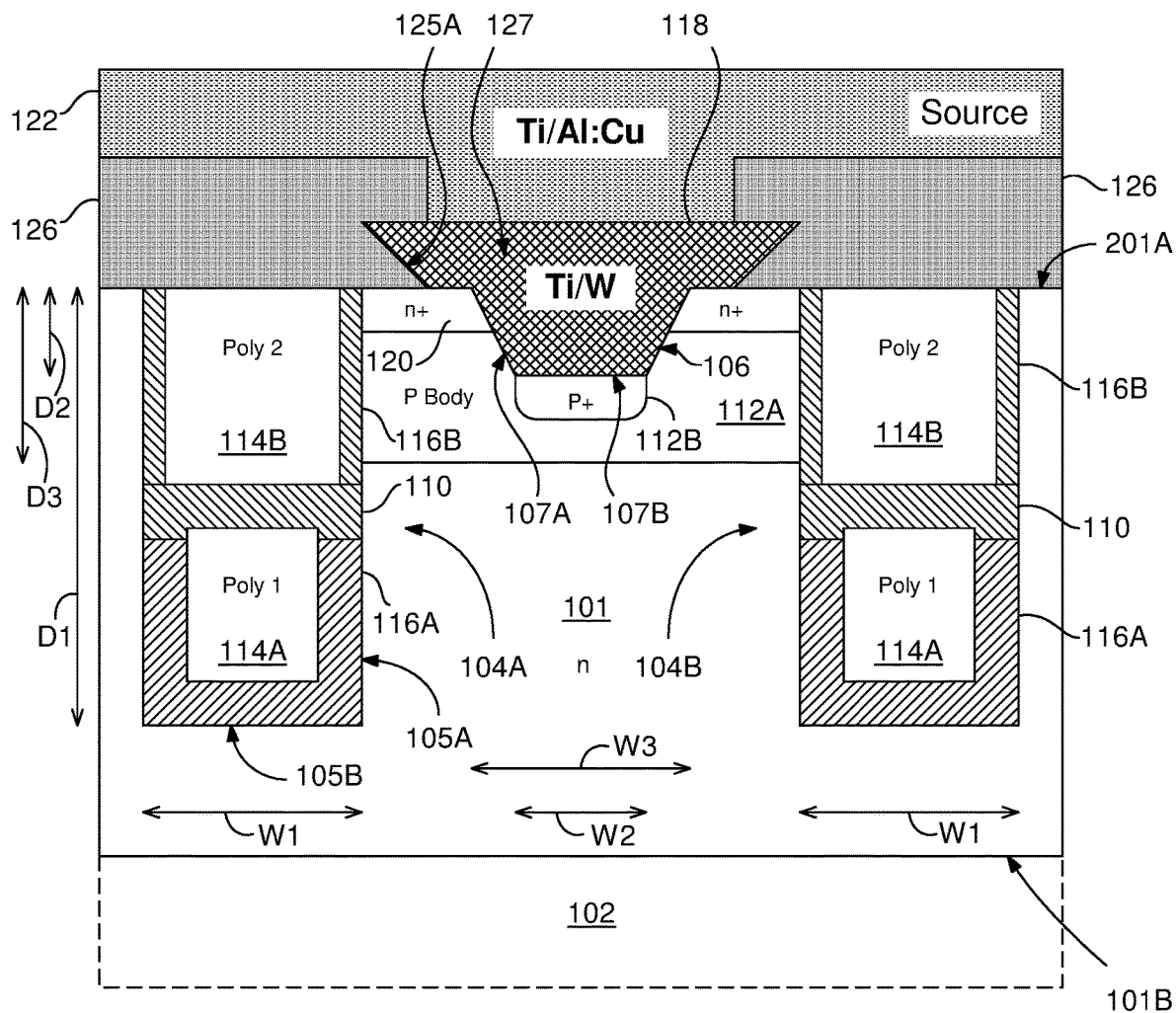
FIG. 1A is a schematic illustration of an embodiment of the present invention including a self-aligned Shielded Gate Trench MOSFET (SGT-MOSFET) device structure.
Figure 1B:
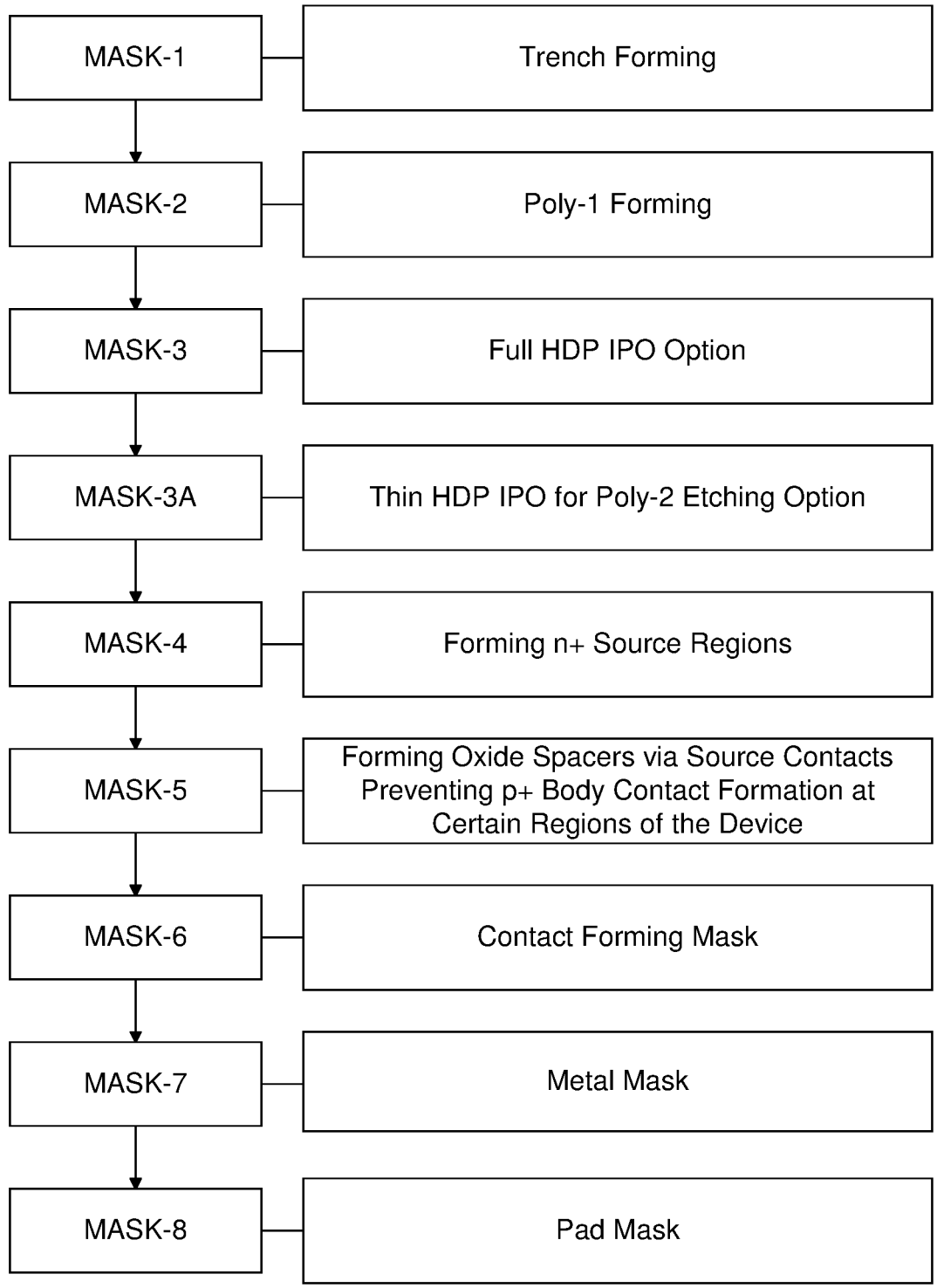
FIG. 1B is a chart showing exemplary major masking steps to form an embodiment of a self-aligned SGT-MOSFET device including an oxide plug.

In an embodiment, an exemplary self-aligned p+ contact MOSFET device, shown in FIG. 1A, may be manufactured with the process steps including: (1) forming oxide plugs on top of the gate trenches, (2) conducting uniform silicon mesa etch back, and (3) forming oxide spacers. FIG. 1B exemplifies the key masking steps and associated processes to form the device.

FIG. 1A illustrates, in schematic cross-sectional view, an embodiment of an active cell structure in an exemplary self-aligned MOSFET device, such as a self-aligned Shielded Gate trench MOSFET (SGT-MOSFET) device 100 (the device 100 herein after) including a semiconductor layer 101 having a front surface 201A or mesa surface 201A and a back surface 101B which may overlie a semiconductor substrate 102. As will be described more fully below, the mesa surface 201A is an etched back surface of the original mesa surface 101A of the semiconductor layer 101. In the below description, the top surface of the silicon layer 101 before the mesa etch back step will be referred to as original mesa surface 101A or the top surface 101A, or the front surface 101A, and after the mesa etch back process, the top surface will be referred to as a lower mesa surface 201A or etched back mesa surface 201A, for clarity purposes.

The semiconductor substrate 102 (the substrate 102 hereinafter) which may be a silicon (Si) substrate, will not be shown in the following process figures for clarity purposes. The semiconductor layer 101 and the substrate 102 may be just a small exemplary portion of a larger die (not shown) or wafer that may include the exemplary active cell structure shown in FIG. 1A. Semiconductor structures and active cell regions described in this disclosure may be formed on the same die using various processes using the same or different masking steps.

In one embodiment, the semiconductor layer 101 may be an epitaxial (epi) single crystal silicon layer grown over the substrate 102. The semiconductor layer 101 (the silicon layer 101 hereinafter) may have a first type of conductivity, or n type of conductivity, i.e., doped with n type of dopants, such as arsenic (As) ions or phosphor (P) ions. The substrate 102 may also have n type of conductivity; however, it may or may not be doped with an n type of dopant concentration higher than the n dopant concentration of the silicon layer 101. In one embodiment, the substrate 102 may be have n++ dopant to indicate its high n dopant concentration.

The silicon layer 101 may include an array of a plurality of MOS gate trenches 104, or shielded gate trenches 104, and p body contact trenches 106 formed in an alternating fashion in an active area 108 of the device 100, and extending orthogonally toward the back surface 101B from the top surface of the silicon layer. In the following disclosure, MOS gate trenches will be referred to as gate trenches 104 and the p body contact trenches will be referred to as contact trenches 106. For clarity, figures in this disclosure generally show only two gate trenches 104, a first gate trench 104A and a second gate trench 104B, located at both sides of the contact trench 106. A shielded gate trench MOSFET device may include a plurality of gate trenches 104 and contact trenches 106 disposed in an alternating fashion, i.e., an order of "gate trench/contact trench/gate trench/contact trench/ . . . ", in an active area of the device.

Figure 2A:
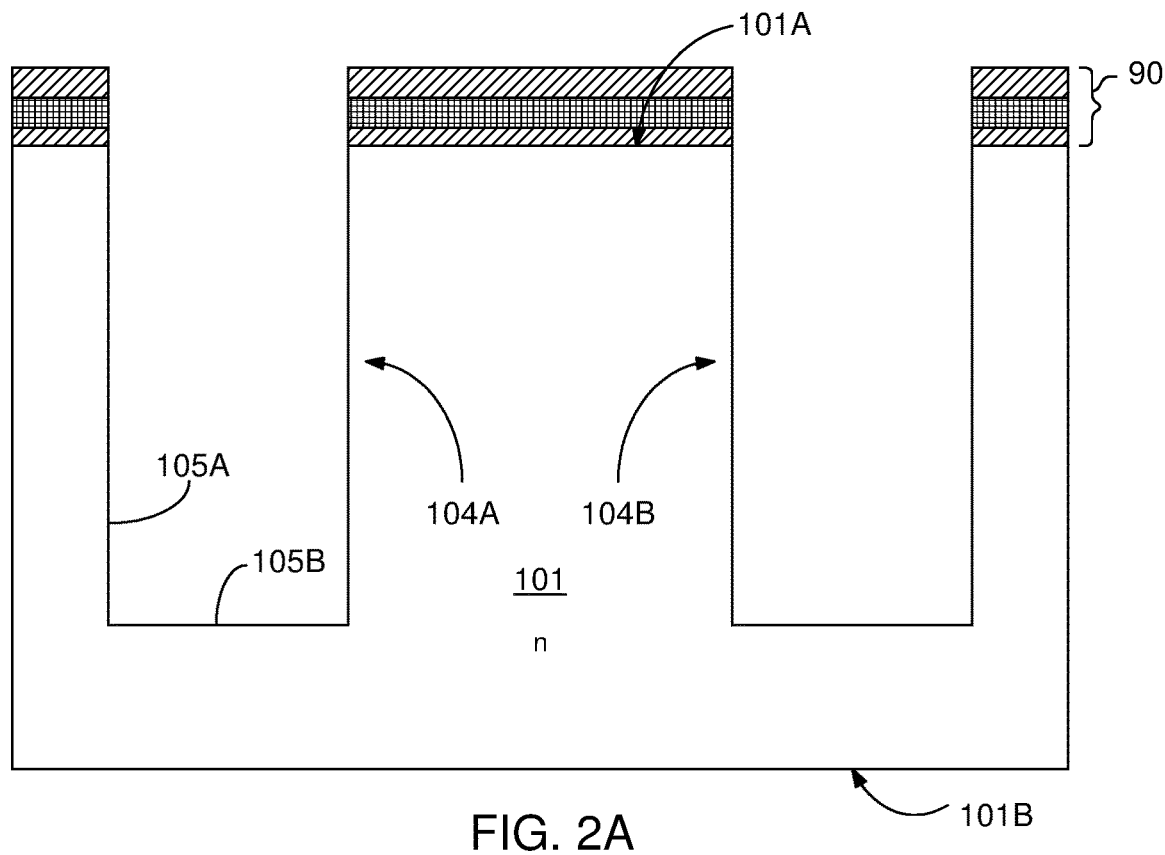
FIGS. 2A-2P are schematic illustrations of an exemplary embodiment of forming a self-aligned SGT MOSFET device by utilizing an oxide plug.
Figure 2B:
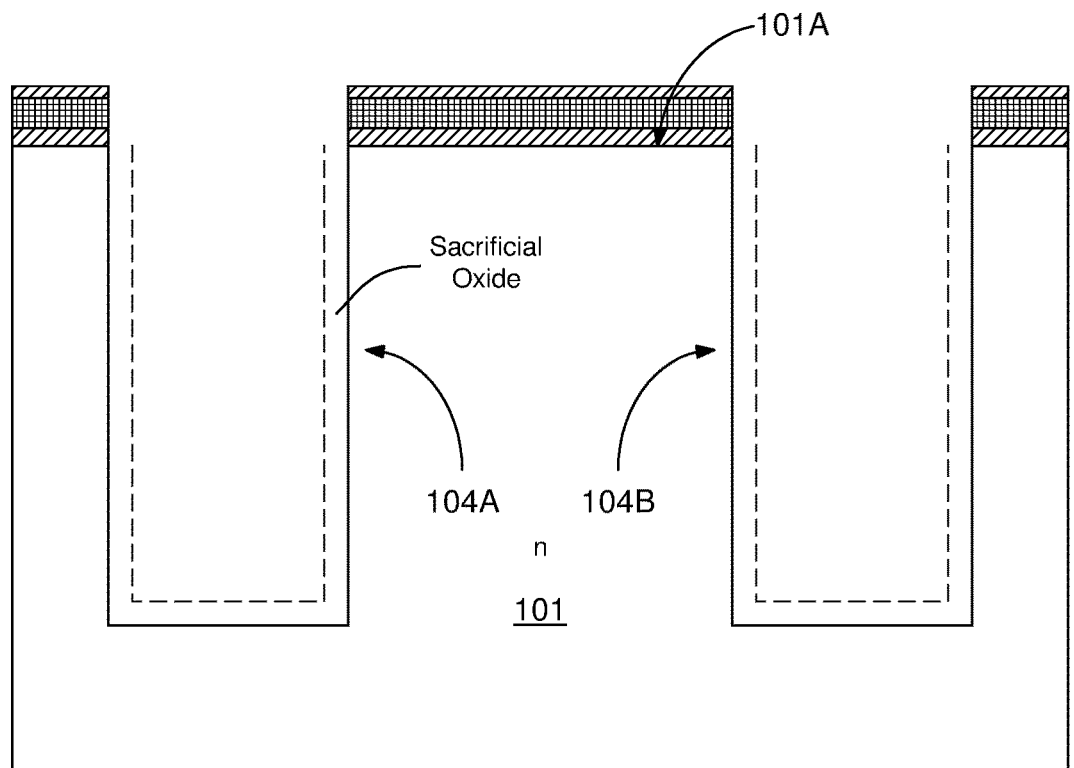
Figure 2C:
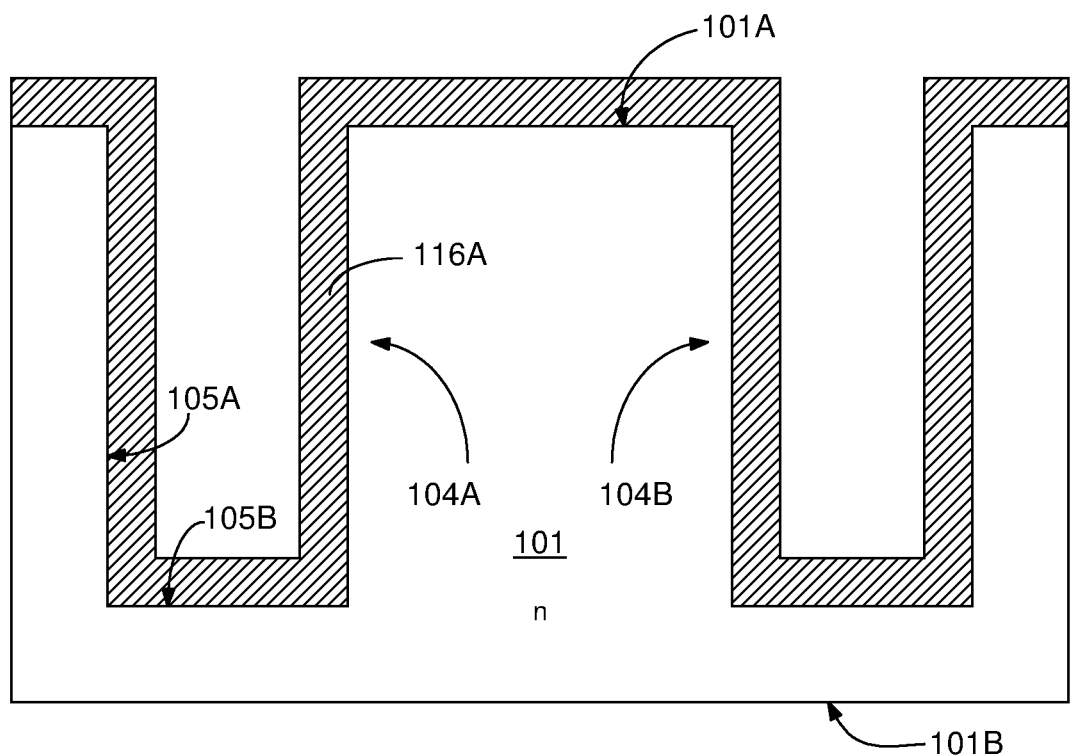

Referring back to FIG. 1A, the gate trenches 104 may be rectangular in cross-section, and the contact trenches 106 may have a generally V-shaped cross-section having side walls ending at a flat bottom wall, which is parallel to the back surface 101B, directed toward the back surface 101B of the silicon layer 101. A vertical axis of symmetry of a contact trench 106 may be perpendicular to the center of the shortest distance line, which is parallel to the top surface of the silicon layer, between the gate trenches 104A, and 104B. As will be shown more fully below in the embodiments, the gate trenches 104 and the contact trenches 106 are formed in the silicon layer 101 by patterning and etching the original mesa surface 101A (FIGS. 2A-2C). During the process of forming them, the gate trenches 104 and the contact trenches 106 may or may not be self-aligned in the semiconductor layer 101, i.e., the measured distances between two gate trenches and a contact trench positioned between them in the array may be the same or different. In one embodiment of the present invention, the contact trenches 106 may be formed after the completion of the gate trench stacks 109 in the gate trenches 104.

The gate trenches 104 may be defined by side walls 105A and a bottom wall 105B, and the contact trenches 106 may be defined by side walls 107A and a bottom wall 107B. The contact trench 106 may be symmetrically positioned between the gate trenches 104, i.e., self-aligned manner. The gate trenches 104 may have a first depth denoted with D1 and a first width denoted with W1. The contact trenches 106 may have a second depth denoted with D2 and a second width W2 (lower end) and a third width W3 (upper end) due to its angled walls. In one embodiment, D1 may be greater than D2, and W1 may be greater than W2 and W3, or greater than W2 and greater than or equal to W3. The first depth D1 may be in the range of about 1-10 microns and the second depth D2 may be in the range of about 0.3-1 micron. The first width W1 may be in the range of about 0.4-2 microns and the second width W2 may be in the range of about 0.1-0.15 microns, and the third width W3 in the range of 0.2-025 microns.

Referring back to FIG. 1A, a first contact region 112A or, a first p body contact region (p body), having a second type conductivity, or p type conductivity, may be formed by implanting p type dopants, such as boron (B) ions, to the semiconductor layer 101 through the mesa surface. The first contact region 112A may have a rectangular cross section and formed in a portion of the semiconductor layer 101 between the gate trenches 104. The first contact region 112A may have a depth D3 measured from the top surface 101A. The depth D3 of the first contact region 112A may be less than the first depth D1 of the gate trench 104 and greater than the second depth D2 of the contact trench 106. An exemplary depth D3 for the first contact region 112A may be in the range of about 0.3-1.0 micron.

As mentioned above, the gate trenches 104 may include gate trench stacks 109 filling the gate trench cavities. Each gate trench stack 109 may include a first poly silicon layer 114A (shield poly silicon), separated from a second poly silicon layer 114B (gate poly silicon) by an inter poly dielectric layer 110. In one embodiment, the first poly silicon layer 114A may fill a bottom half of the gate trench 104 and the second poly silicon layer 114B may fill the upper half of the gate trench 104. In one embodiment, the inter poly dielectric layer 110 may be an inter poly silicon oxide layer 110 formed in accordance with a process of the present invention. The inter poly silicon oxide layer 110, or inter poly oxide layer 110, will be referred to as IPO layer 110, hereinafter. In one embodiment, a shield oxide ($SiO_2$) layer 116A may be formed on a bottom half of the side walls and the bottom wall of the gate trench 104. The shield oxide layer 116A and the IPO layer 110 may electrically insulate the first poly silicon layer 114A. A gate oxide ($SiO_2$) layer 116B may be formed on an upper half of the side walls of the gate trench 104. The gate oxide layer 116B and the IPO layer 110 may electrically insulate the second poly silicon layer 114B.

In one embodiment, both the first poly silicon layer 114A and the second poly silicon layer 114B may be doped with n type dopants, thus including n+ poly silicon material (n+ poly). This arrangement of poly silicon layers in insulated gate trenches may be called double poly or shielded gate trench structures including n+ poly 1 (first n+ poly silicon layer) and n+ poly 2 (second n+ poly silicon layer). Shielded gate trench MOSFET structures may yield low drain to gate capacitance for faster switching of the MOSFET device.

Referring back to FIG. 1A, a second contact region 112B, or the second p body contact region (p+ body), may be formed under the contact trench 106 by implanting dopants of the second type of conductivity through the bottom wall 107B of the contact trench 106. The second contact region 112B may be doped with a p type dopant ion concentration higher than the p type dopant ion concentration of the first contact region 112A, which is denoted with p+. The second contact region 112B may be in contact with a contact conductor 118 filling the contact trench 106 and may include a generally rectangular border expanding from the bottom wall 107B and extending in the direction of the back surface 101B.

Referring back to FIG. 1A, the source contact regions 120 adjacent the front surface may extend between the contact trench 106 and the gate trenches 104 located at both sides of the contact trench 106. The source contact regions 120 (source regions) may be doped with high doses of n type of dopant ions, and thus they will be referred to as n+ source contact regions or n+ source regions.

In one process embodiment, the contact trenches 106 may be formed after forming the first contact regions 112A (p body region) and the source contact regions 120 (n+ source regions) by etching the semiconductor layer 101 having the first contact regions 112A and the source contact regions 120 between the gate trenches 104. In another process embodiment, the contact trenches 106 may be formed together with the gate trenches and plugged with an oxide ($SiO_2$) plug throughout the process of forming the gate trench stacks 104, the first contact regions 112A and the source contact regions 120. The oxide plug is removed after the formation of the first contact regions 112A and the source contact regions 120. In both process embodiments, the second contact regions 112B may be formed implantation through the contact trenches 106.

To make the contact trench 106 in the silicon layer 101 narrower or smaller than the photolithography capability of a wafer fab, oxide spacers 125A may be formed on the side walls of the contact windows 127, or contact opening 127, which are wider than the width of a contact formed in an oxide layer 125.

A contact conductor 118 (plug), filling both the contact trench 106 and the contact window 127 with the spacers 125A, may be a part of a source electrode 122 (source metal), may be in contact with the n+ source regions 120, the p body region 112A and the p+ region 112B. As will be shown more fully below, in one embodiment, an exemplary oxide layer 125 may include an undoped silicon oxide layer. After forming the contact trench in the silicon layer and filling it with contact conductor 118, a borophosphosilicate glass (BPSG) layer is deposited on top of the oxide layer 125 and planarized. The oxide layer may also form a diffusion barrier between the BPSG layer and the top surface of the silicon layer 101 as well as the adjacent oxide layers such as a surface oxide layer. The surface layer, or the surface oxide layer, may be located between the top surface of the silicon layer 101 and the oxide layer 125. A passivation layer may coat the source electrode 122. The source metal 122 may be a layer of Ti/Al:Cu. The contact conductor 118 (contact plug) may include Ti/W.

Embodiments of exemplary processes to form the SGT MOSFET device 100 of FIG. 1A will be described below with respect to the chart shown in FIG. 1B and process steps show in FIGS. 2A-2P. FIG. 1B shows a lists of key masking steps to implement current invention.

FIGS. 2A-2C show an exemplary processing using a first mask (M1 mask) to form the gate trenches 104 in an exemplary active MOSFET cell area of the silicon layer 102 prior to forming, for example, a gate trench stack 109 and other features shown in FIG. 1A final structure after an exemplary silicon trench etching process. Mask 1 is a trench mask to etch the hard mask layer 90, which may be either an oxide layer, or oxide, nitride and oxide (ONO) layers, via a photoresist (PR) layer. After defining the hard mask 90 by etching the oxide and nitride layers of it, and removing the PR layer, the gate trenches 104 may be defined by Reactive Ion Etching (RIE) the silicon layer 101 using the hard mask. A final structure after an exemplary silicon trench etching process is shown in FIG. 2A.

FIG. 2B shows a cross-section of the silicon layer 101 after growing and removing a sacrificial oxide to the thickness of about 200-500 Å in order to minimize the damages on sidewalls 105A and bottom walls 105B created during the RIE etching. After the hard mask 90 and the sacrificial oxide are removed, a liner oxide layer 116A (trench oxide layer or $SiO_2$ layer) is formed by either thermal oxide growth or combination of thermal or deposited oxide. FIG. 2C shows the liner oxide 116A conformally coating the front surface 101A and gate trenches 104 after the liner oxide forming process.

After forming the liner oxide 116A, an n+ doped poly silicon may be deposited on the front surface 101A to fill the trenches 104A and 104B lined by the liner oxide 116A, followed by planarization of the n+ polysilicon, using Chemical Mechanical Polishing (CMP). Mask 2 may be used to etch down the n+ poly silicon to form the first poly silicon layer 114A.

Figure 2D:
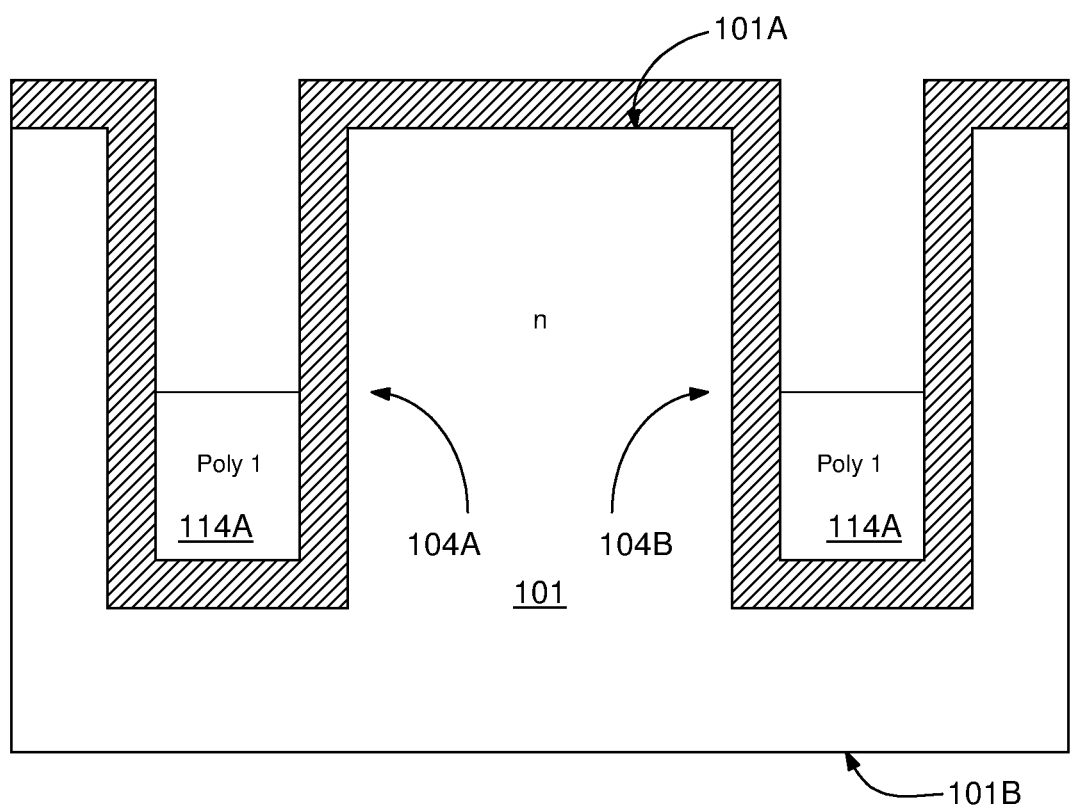
Figure 2D:
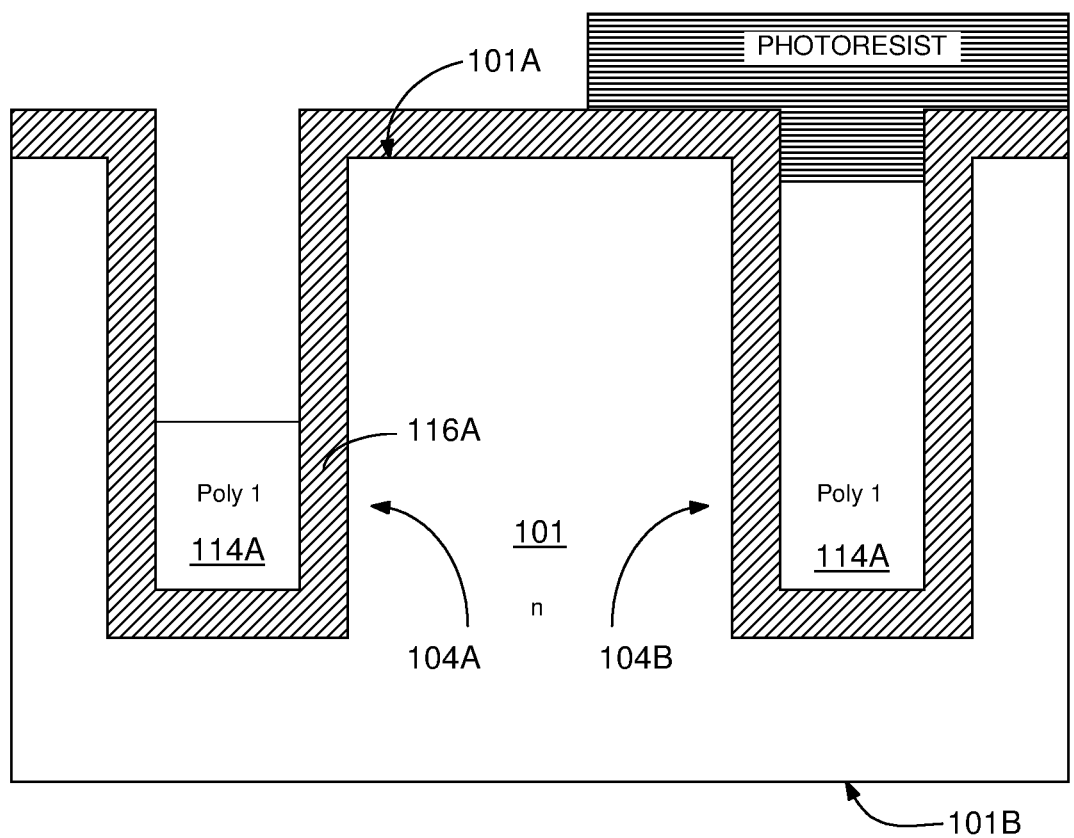

FIG. 2DA shows a cross-section of the active MOSFET cell area structure with the first poly silicon layer 114A formed within the gate trenches 104A, 104B using Mask 2. FIG. 2DB shows different structure at another part of the MOSFET device where the first poly silicon layer 114A partially filling the first gate trench 104A as a result of etch-down process, and fully filling the second gate trench 104B as a result of protecting it under a photoresist layer while etching down the n+ poly silicon in the first gate trench 104A. In FIG. 2DB, the first poly silicon layer 114A filling the trench 104B is used to contact first poly silicon layer 114A, and it is etched back 0.2-0.3 microns below the top surface 101A of the silicon layer 101 (the mesa surface).

Figure 2E:
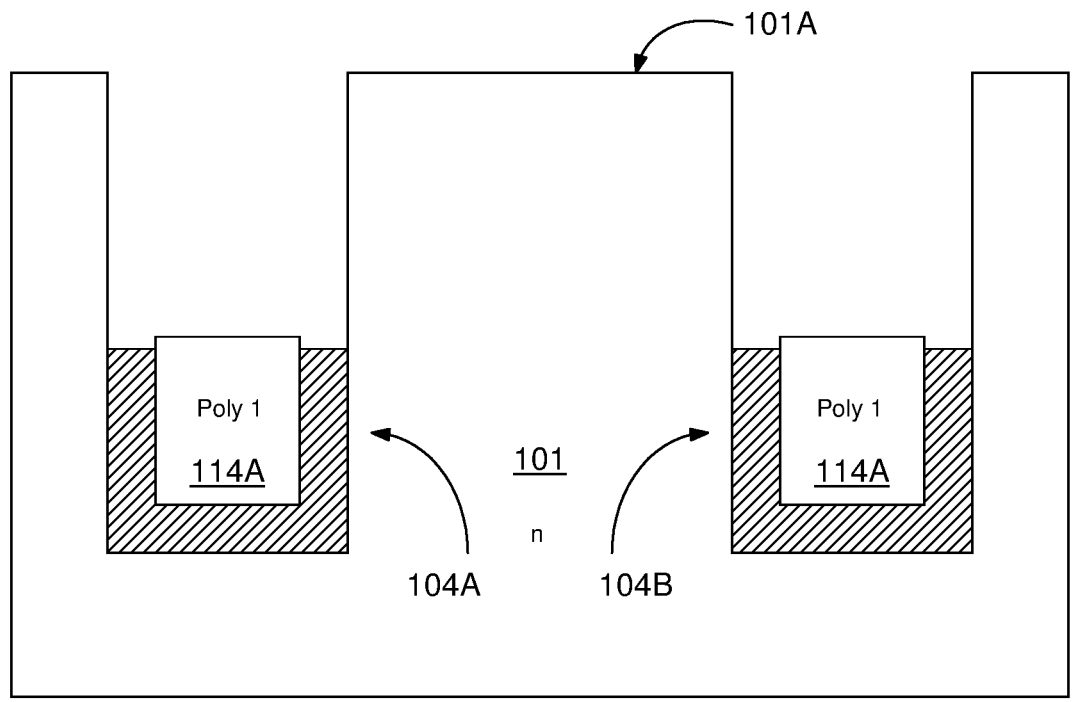
Figure 2E:
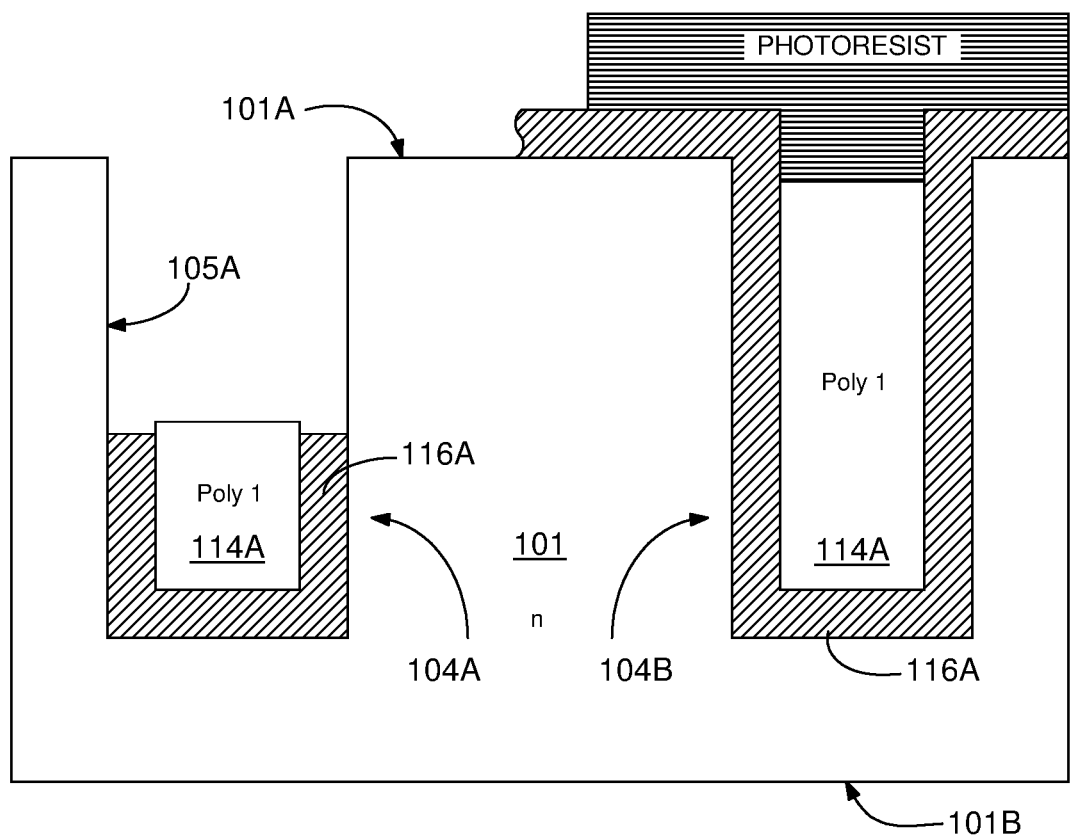

FIG. 2EA shows a cross section of the active MOSFET cell area, following the process step shown in FIG. 2DA. Using Mask 2, the liner oxide 116A may be removed (etched back) from the front surface 101A and upper parts of the trench sidewalls 105A, as shown in FIG. 2EA. In this etched back form, the remaining liner oxide layer surrounding side and bottom surface of the first poly silicon layer 114A becomes shield oxide layer 116A of the gate trenches 104A and 104B.

FIG. 2EB shows the structure, following the process step shown in FIG. 2DB, where only the liner oxide 116A covering the side walls 105A and the adjacent mesa surface of the gate trench 104A is removed as a processing example.

Figure 2F:
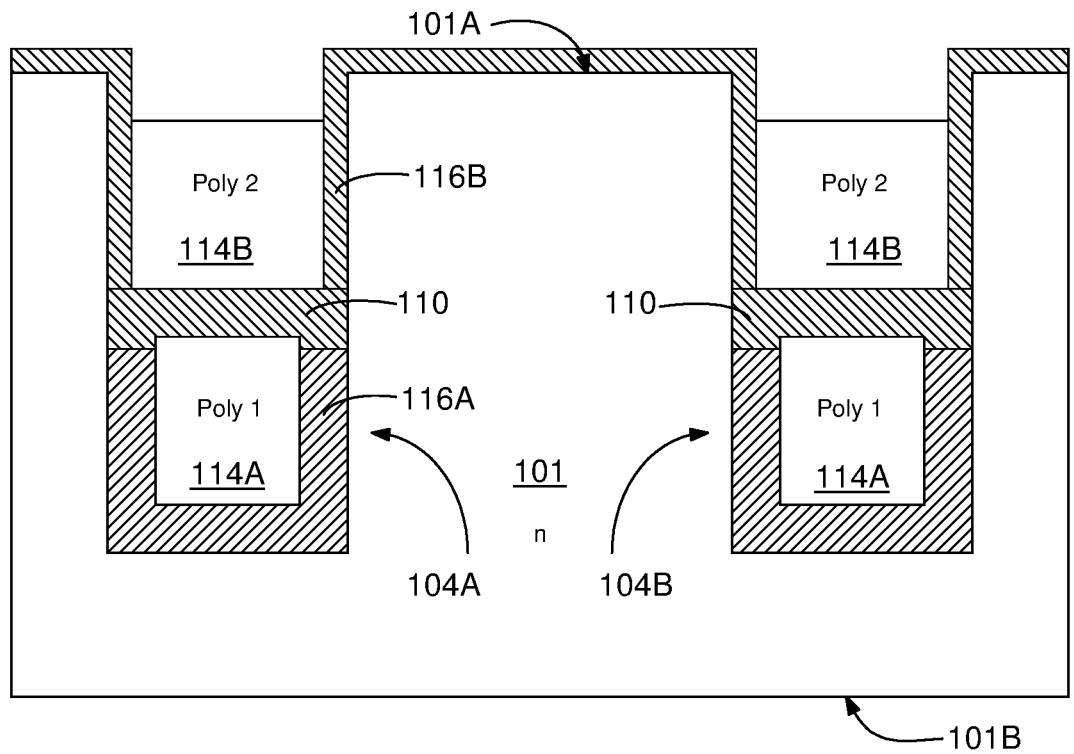
Figure 2F:
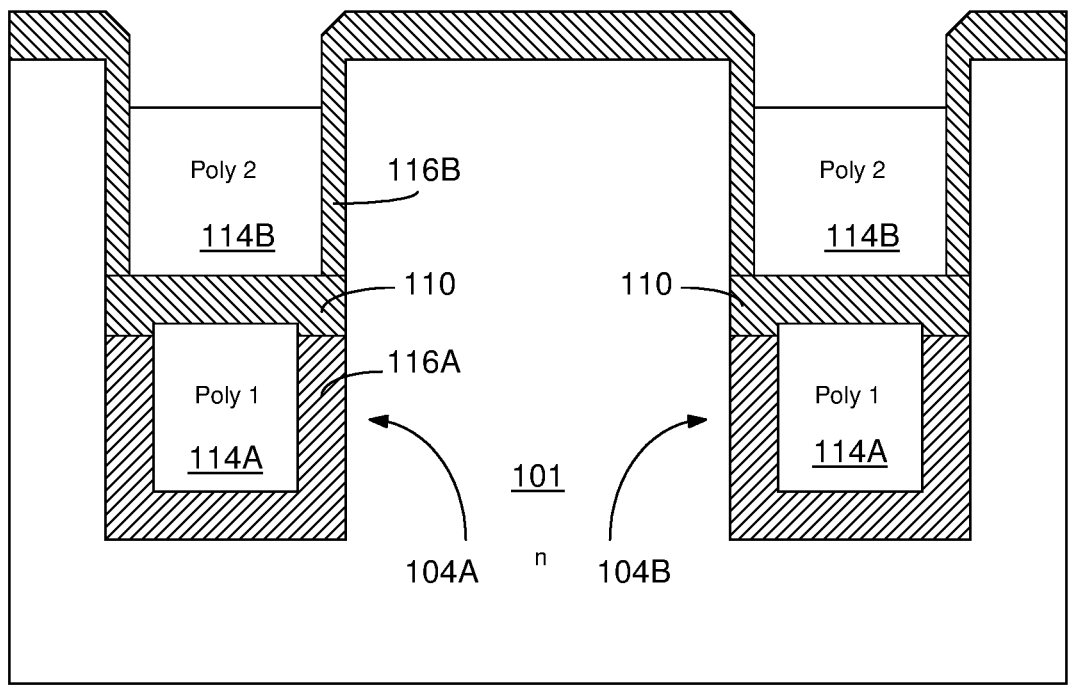

Referring to FIG. 2FA, after the process step shown in FIG. 2EA, any remaining photoresist layer is removed from Mask 2 and a thermal oxide is grown to about 200 Å on the exposed portions of the side walls 105A and the mesa surface 101A. In the following step, a High-Density Plasma (HDP) oxide (not shown) may be deposited to fill the trenches 104A and 104B in one process approach. Next, the HDP oxide may be etched back to form an Inter Poly Oxide (IPO) layer 110 on top of the first poly silicon layer 114A via Mask 3.

A sacrificial oxide (not shown) may be grown and removed to minimize the damages on the exposed portions of the trench sidewalls 105A as done previously. Next, a gate oxide layer 116B may be thermally grown on the exposed portions of the sidewalls 105A, an n+ poly silicon may be deposited on the gate oxide and the IPO layer 110. This may be followed by planarizing by CMP and etching back the n+ poly silicon to about 0.2-0.5 μm below the mesa surface 101A to form the second poly silicon layer 114B, as shown in FIG. 2FA.

An alternative approach of forming the IPO layer 110 may be done via a thin layer of HDP deposition. The HDP oxide tends to deposit 5 times more on bottom or flat surfaces compared to the vertical trench sidewalls of the trenches. As a result, a thicker HDP oxide layer on top of the first poly silicon layer 114A may form the IPO layer 110 after etching of the HDP oxide portions on the sidewalls so as to leave the HDP oxide layer portion on top of the first poly silicon layer 114A and the mesa surface 101A as shown in FIG. 2FB. This may also be followed by planarizing by CMP and etching back the n+ poly silicon to about 0.2-0.5 μm below the mesa surface 101A to form the second poly silicon layer 114B. This IPO forming approach may form a more consistent or less variable IPO layer thickness lot to lot.

Figure 2G:
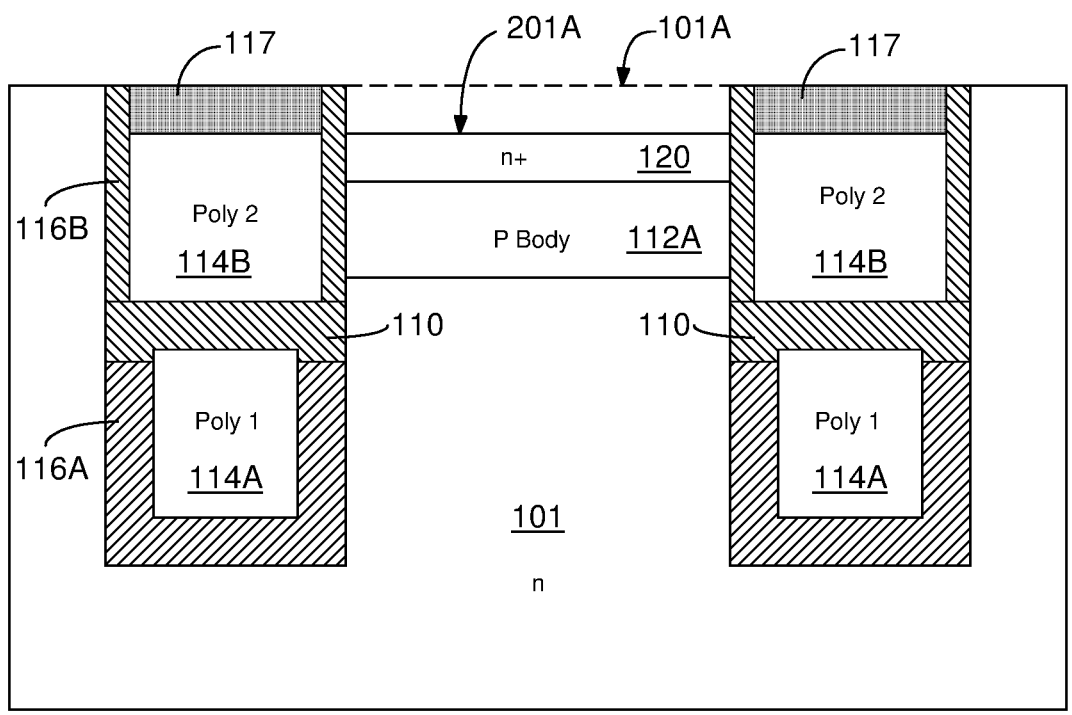
Figure 2G:
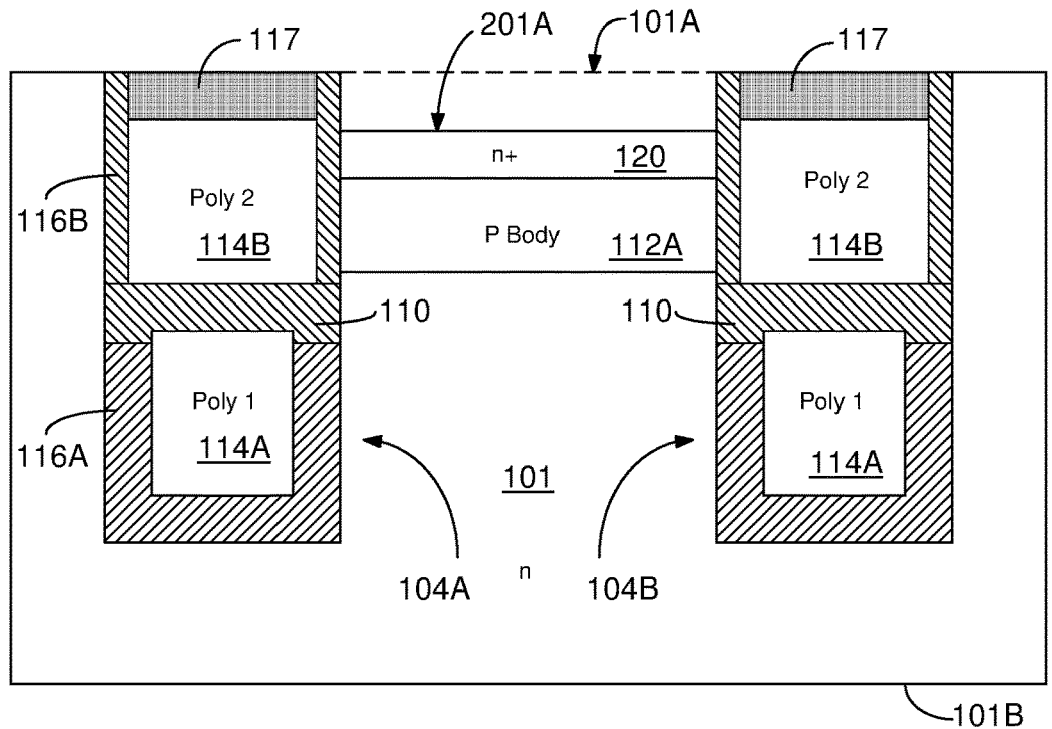
Figure 2G:
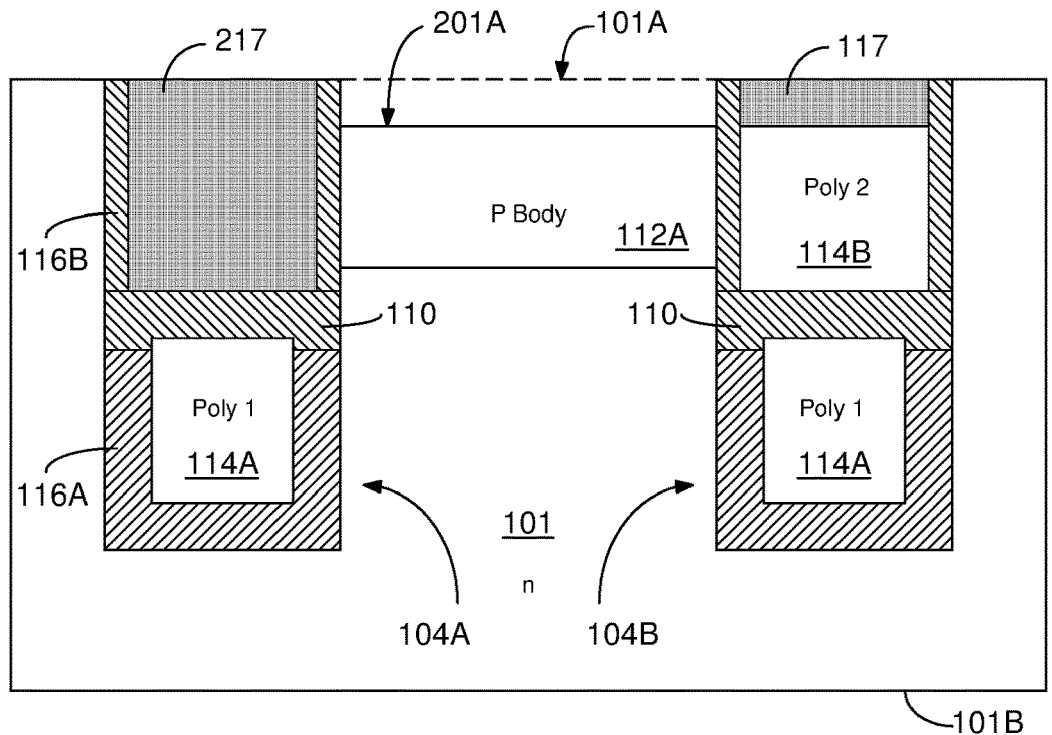
Figure 2G:
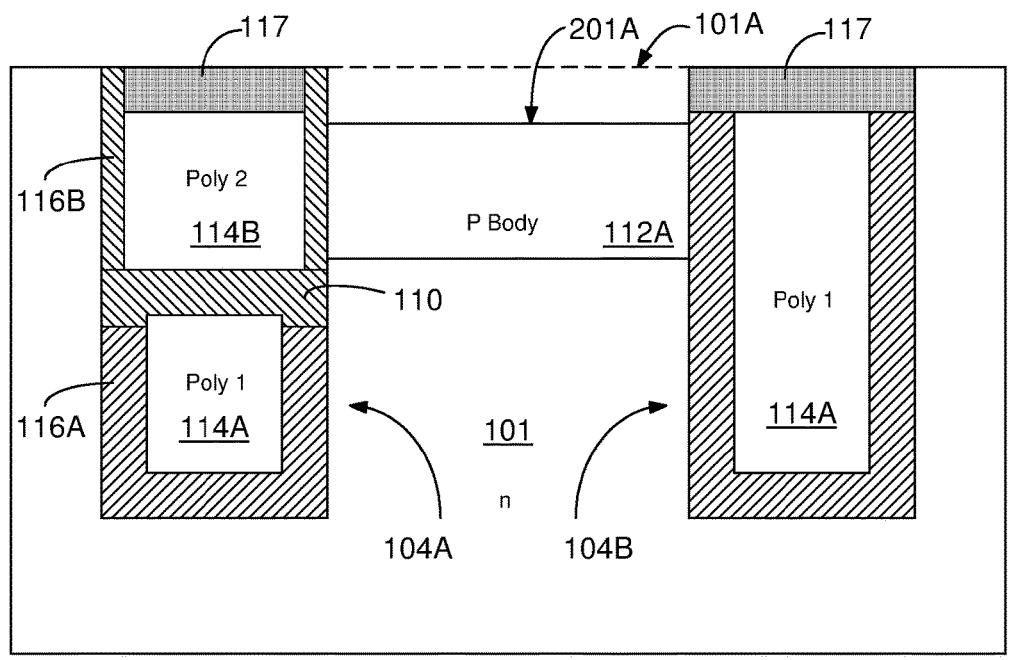

FIGS. 2GA-2GB show embodiments of structures after process steps of partially oxide filling the gate trenches 104 for forming oxide plugs 117, conducting mesa etch back on the mesa surface 101A to from an etched back or lower mesa surface 201A, p body region formation and source implant doping to form source regions via Mask 4. FIG. 2GA shows, in an embodiment, an n+ source region 120 formed in the etched back mesa surface 201A with minimal overlap with oxide plugs 117 of the present invention. FIG. 2GB shows, another embodiment, an n+ source region 120 formed in the etched back mesa surface 201A without overlap with oxide plugs 117 of the present invention.

FIGS. 2GC-2GD show lateral IPO region after oxide plug on top of gate trenches 104 (on gate stacks 109), mesa etch back, p body formation and source implant via Mask 4. FIG. 2GC shows, in an embodiment, an oxide layer 217 formed over the first poly silicon layer 114A. FIG. 2GD shows, in an embodiment, oxide plug 117 on top of the first poly silicon layer 114A filling the trench 104B.

As exemplified in FIG. 2GC, to laterally isolate the first poly silicon 114A from the second polysilicon 114B on certain regions of the device where the first poly silicon 114A is brought to the surface of the wafer, mask 3A is used to remove or etch down the second poly silicon 114B to the level of the IPO layer 110, which is followed by filling with oxide and forming the oxide layer 217 over the IPO layer 110.

Deposition of oxide (SiO$_2$) to fill the trenches on top of the second poly silicon layer 114B (for example as shown in FIG. 2GA) or the first polysilicon layer 114A (for example, as shown in FIG. 2GD) may be followed by CMP planarization to form the oxide plugs 117.

After formation of oxide plugs 117, the oxide deposited on the mesa surface 101A is etched down to expose the lower mesa surface 201A without removing the plugs on top of the second poly silicon layer 114B or the first poly silicon layer 114A. Using oxide plugs 117 such way as masks, the silicon layer 101 may be etched down to about 0.2-0.5 μm below original mesa surface 101A to form the lower mesa surface 201A. The lower mesa surface 201A may be slightly above or below the top surface of the second poly silicon layer 114B but both surfaces may be targeted to be substantially the same level.

In the following step, an etch down process may be conducted isotopically without creating silicon spacers along trench sidewalls 105A. A screen oxide layer (not shown) of about 200-300 Å may be formed via thermal oxidation or deposition. Following screen oxide formation, boron ions implanted to form p body regions 112A of the MOSFET devices. Using mask 4, arsenic ions are implanted to form n+ source regions 120 of the MOSFET devices as shown in FIG. 2GC and FIG. 2GD. Arsenic may be blocked in certain regions of the device as shown in FIG. 2GC and FIG. 2GD.

Figure 2H:
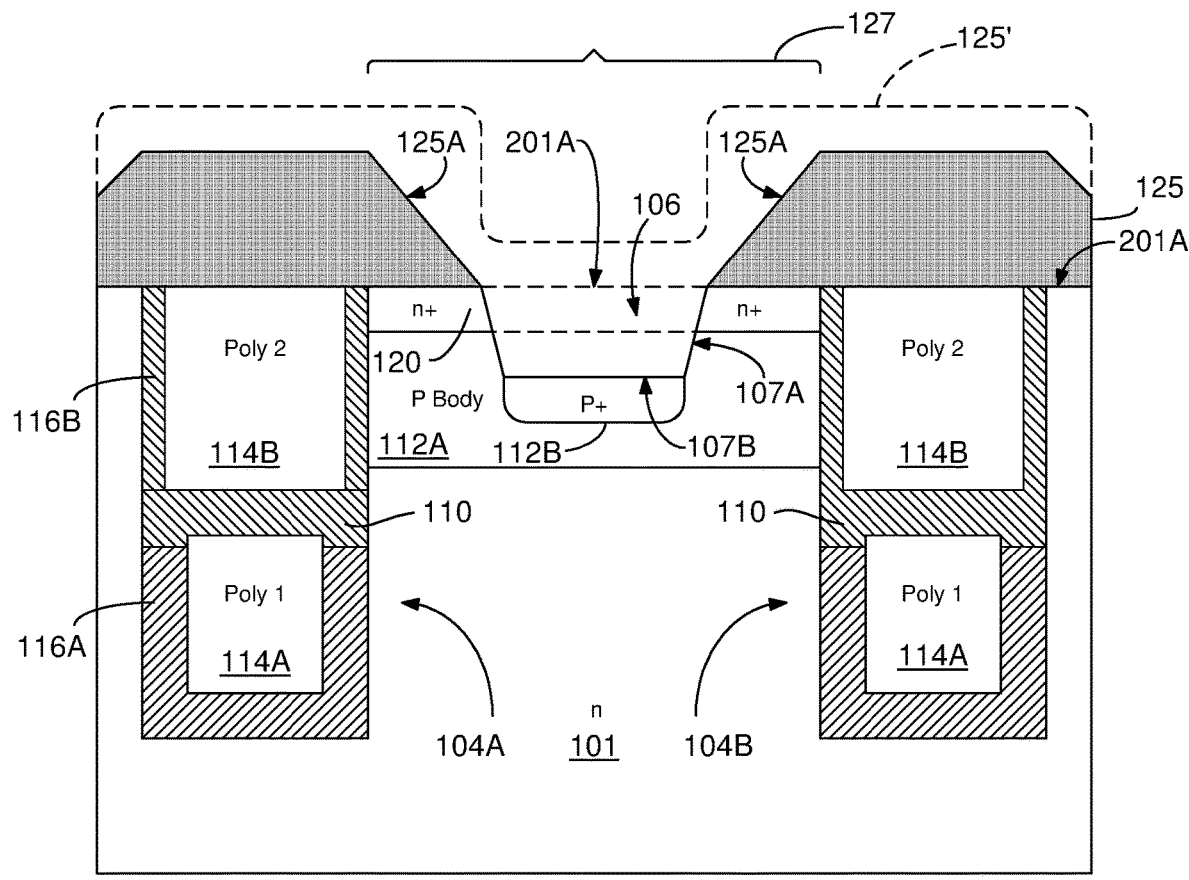

Referring to FIG. 2H, after forming and the planarizing the oxide plugs 117 as shown for example in FIG. 2GA, in the following process steps, initially an oxide layer 125' formed on the lower mesa surface 201A and on the oxide plugs 117. The oxide layer 125' may be formed by depositing an undoped oxide layer. The oxide layer 125' may be deposited in a thickness range of about 500-1000 Å. It should be noted that, in FIG. 2H, the initially deposited oxide layer 125' covering the oxide plugs 117 and the lower mesa surface 201A is shown with dotted line. Further, in FIG. 1H, the oxide layer 125, however, identifies the remaining portions of the oxide layer 125' after the RIE etch back, contact trench forming and filling, and planarization before the BPSG deposition. The oxide layer 125 includes the spacers 125A and the oxide plugs as integral parts of the oxide layer 125.

As shown in FIG. 2H, as the oxide layer 125' is etched back using RIE with Mask 5, an opening 127 in the oxide layer 125' defined by the oxide spacers 125A may be formed. The oxide spacers 125A may form adjacent the oxide plugs 117 and may cover both end portions of the lower mesa surface 201A adjacent the gate trenches 104. In the next step, using oxide spacers 125A and Mask 5, the mesa surface 201A including the n+ source region 120 may be etched back to form the contact trench 106 defined by sidewalls 107A and bottom wall 107B in the silicon layer 101. Next, boron ions may be implanted through the bottom wall 107B of the contact trench 106 to form p+ contact regions 112B underneath the bottom wall 107A, as shown in FIG. 2H.

Figure 2I:
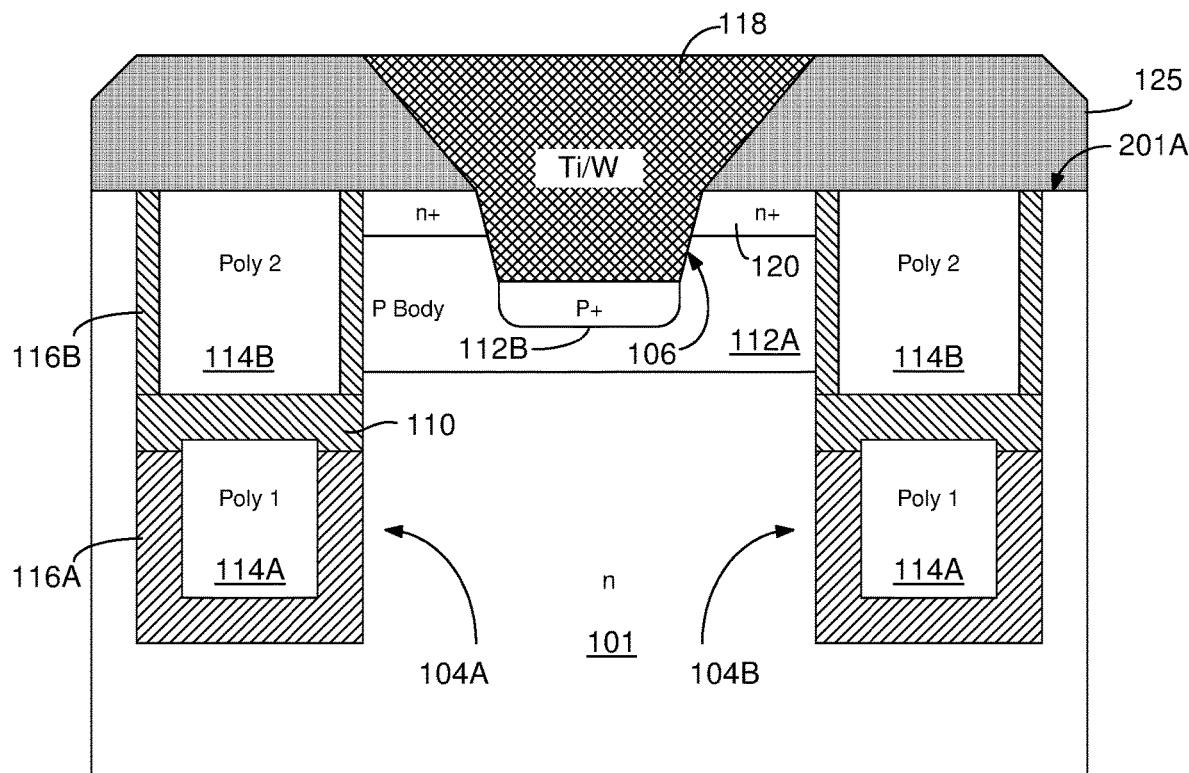

As shown in FIG. 2I, after forming the p+ contact region 112B, the contact trench in the silicon layer 101 and the opening 127 in the oxide layer 125 may be filled with the contact conductor 118, or the contact plug 118, including tungsten (W). The contact conductor 118 may be formed, for example, by sputtering Ti/TiN and Chemical Vapor Deposition (CVD) of W. CMP planarization may follow the W deposition step. After the CMP planarization, a BPSG layer is deposited on the contact conductor 118 and the oxide layer 125. The oxide layer 125 and the BPSG layer will be referred to as dielectric layer 126 hereinbelow.

Figure 2J:
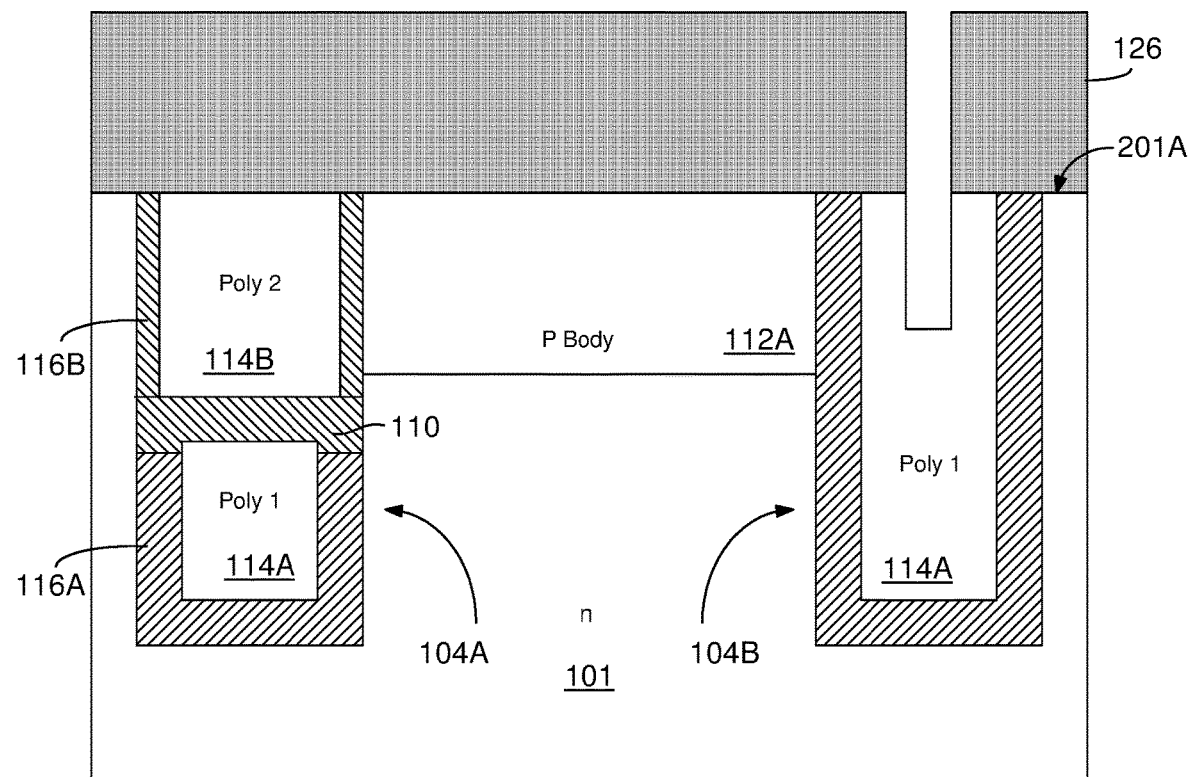
Figure 2J:
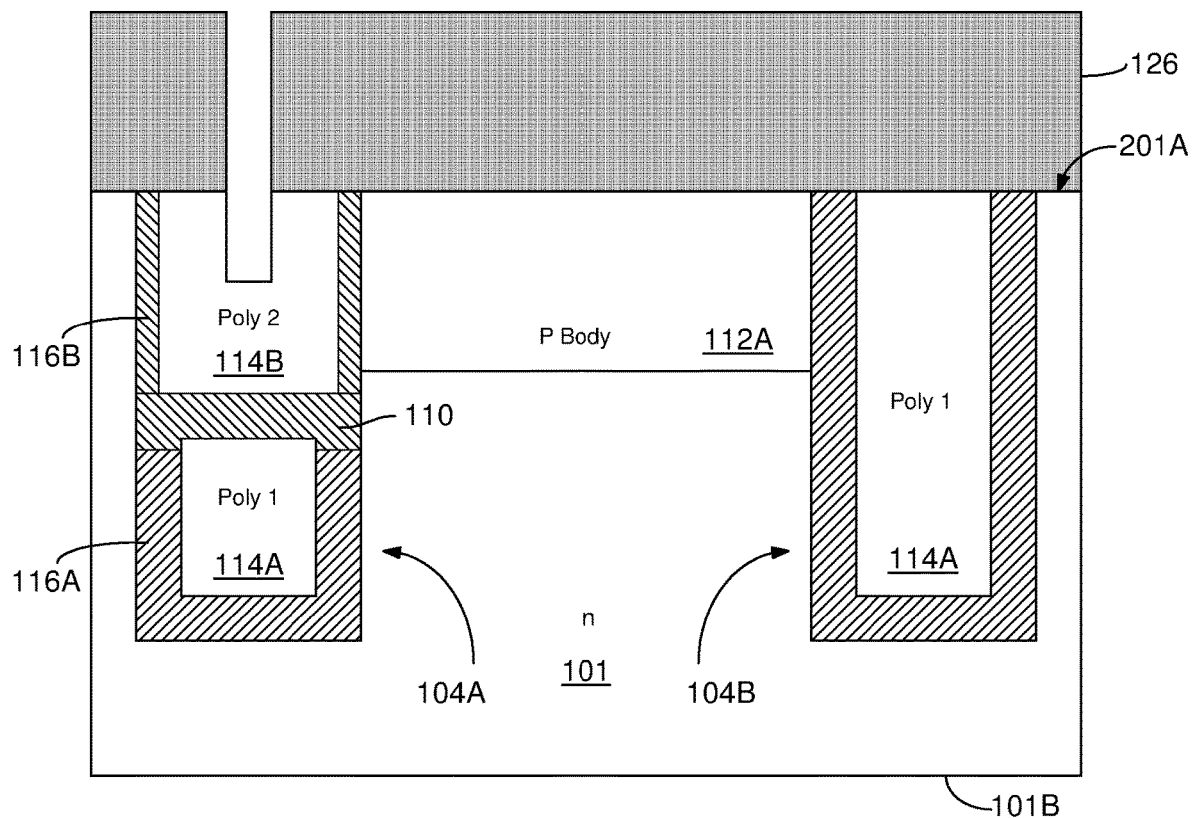

FIG. 2JA shows a contact etching to the first poly silicon layer 114A and FIG. 2JB shows a contact etching to the second polysilicon layer 114B, through the dielectric layer 126, using borophosphosilicate glass (BPSG) as Mask 6.

Figure 2K:
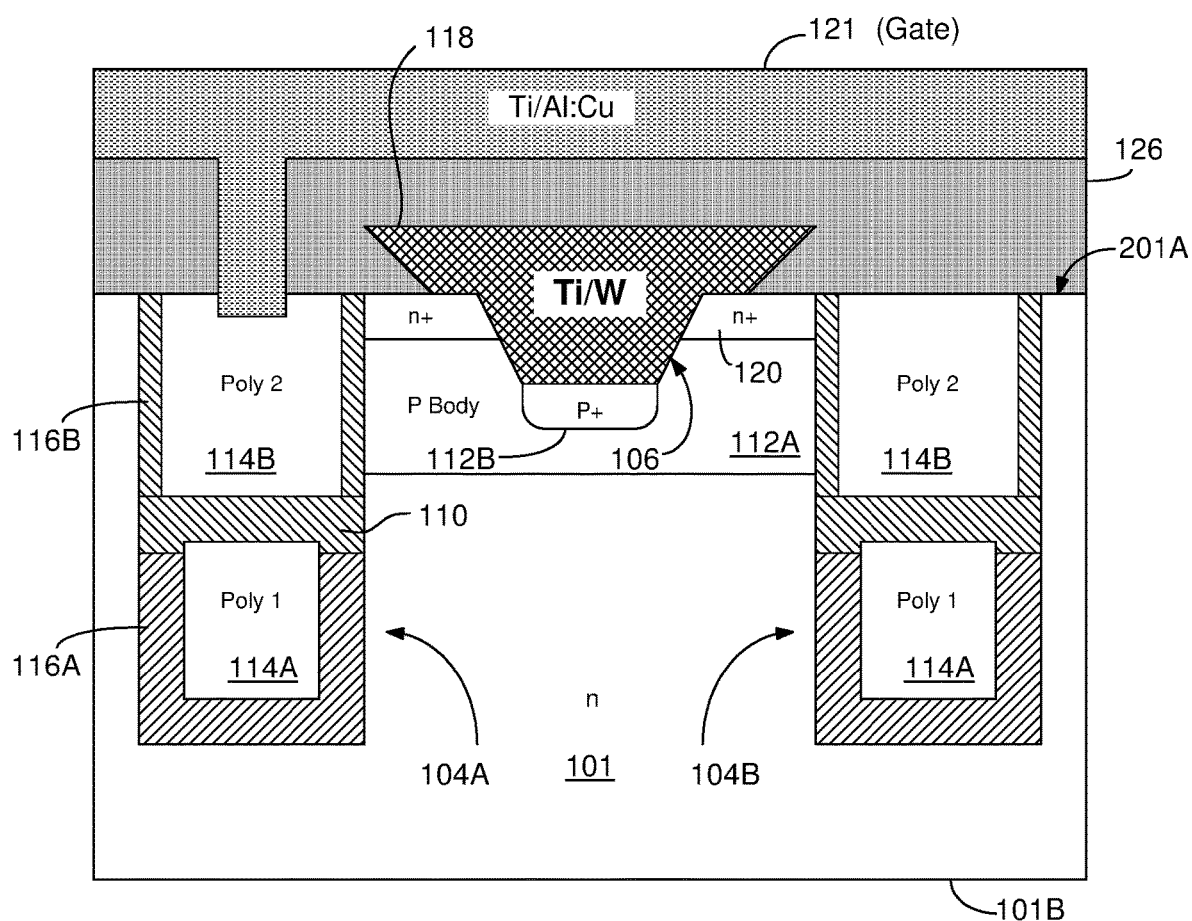
Figure 2L:
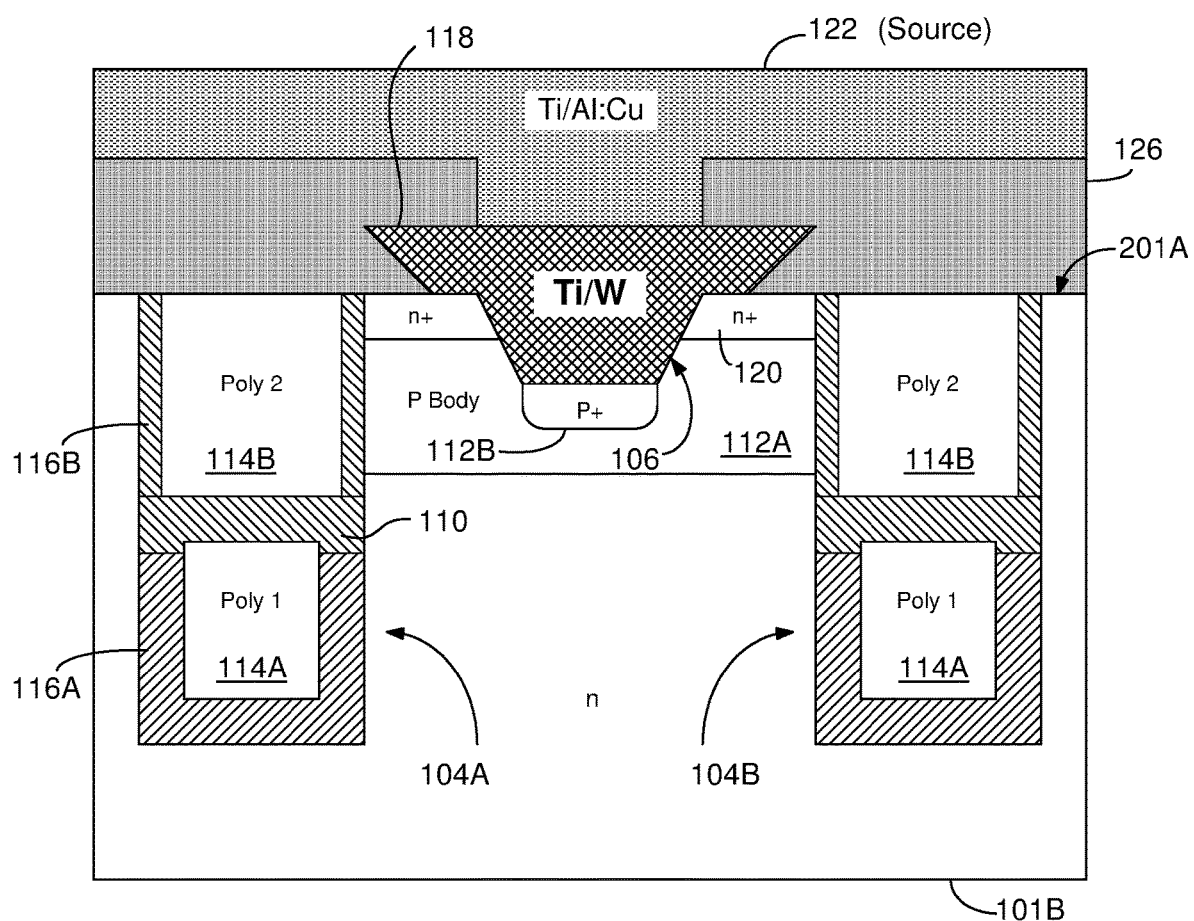

FIG. 2K shows a gate metal 121 connection to the second polysilicon layer 114B and FIG. 2L shows the source metal 122 connection to the second polysilicon layer 114B, after the metallization steps.

Figure 2M:
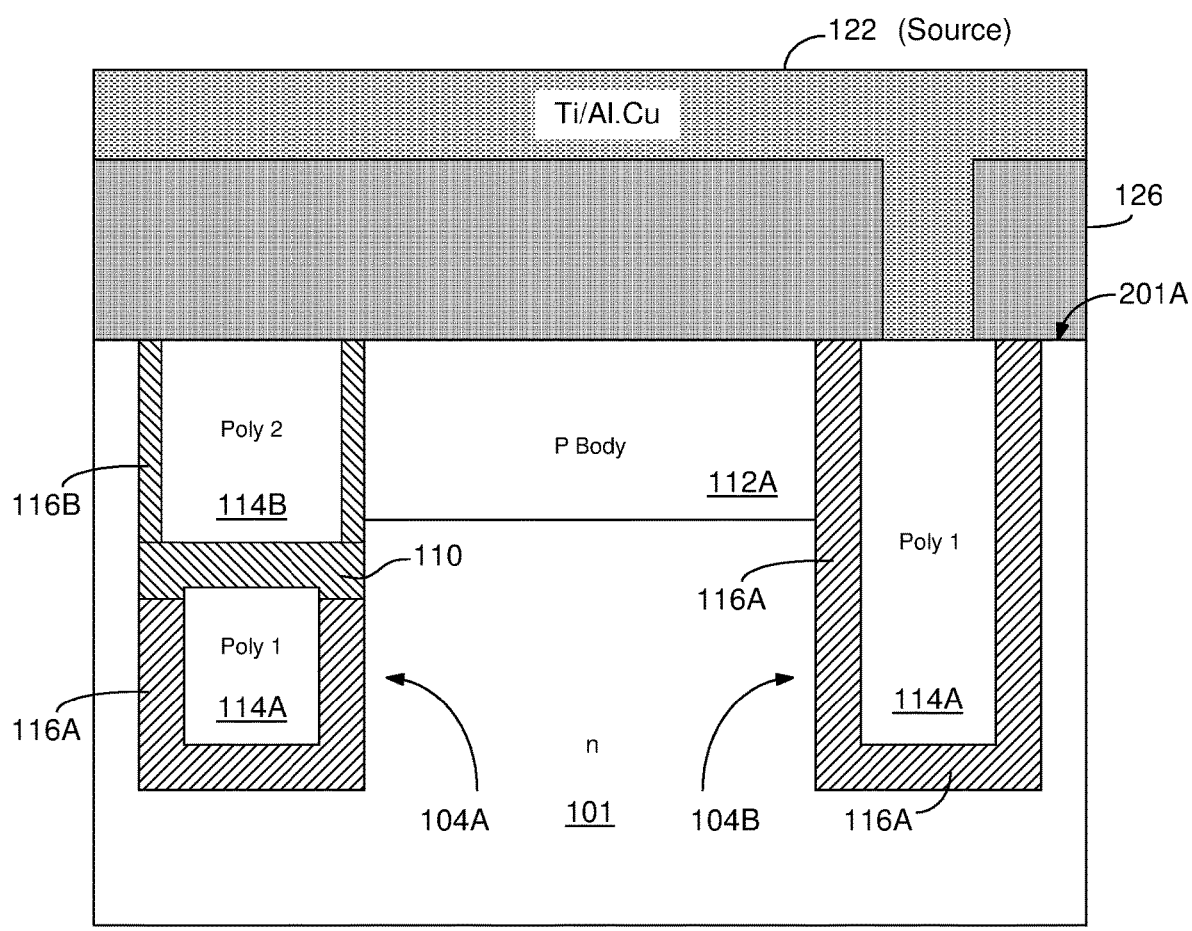

FIG. 2M shows an exemplary contact region between the source metal 122, via the dielectric layer 126, and the first poly silicon layer 114A in the trench 104B after metallization, using mask 7.

Figure 2N:
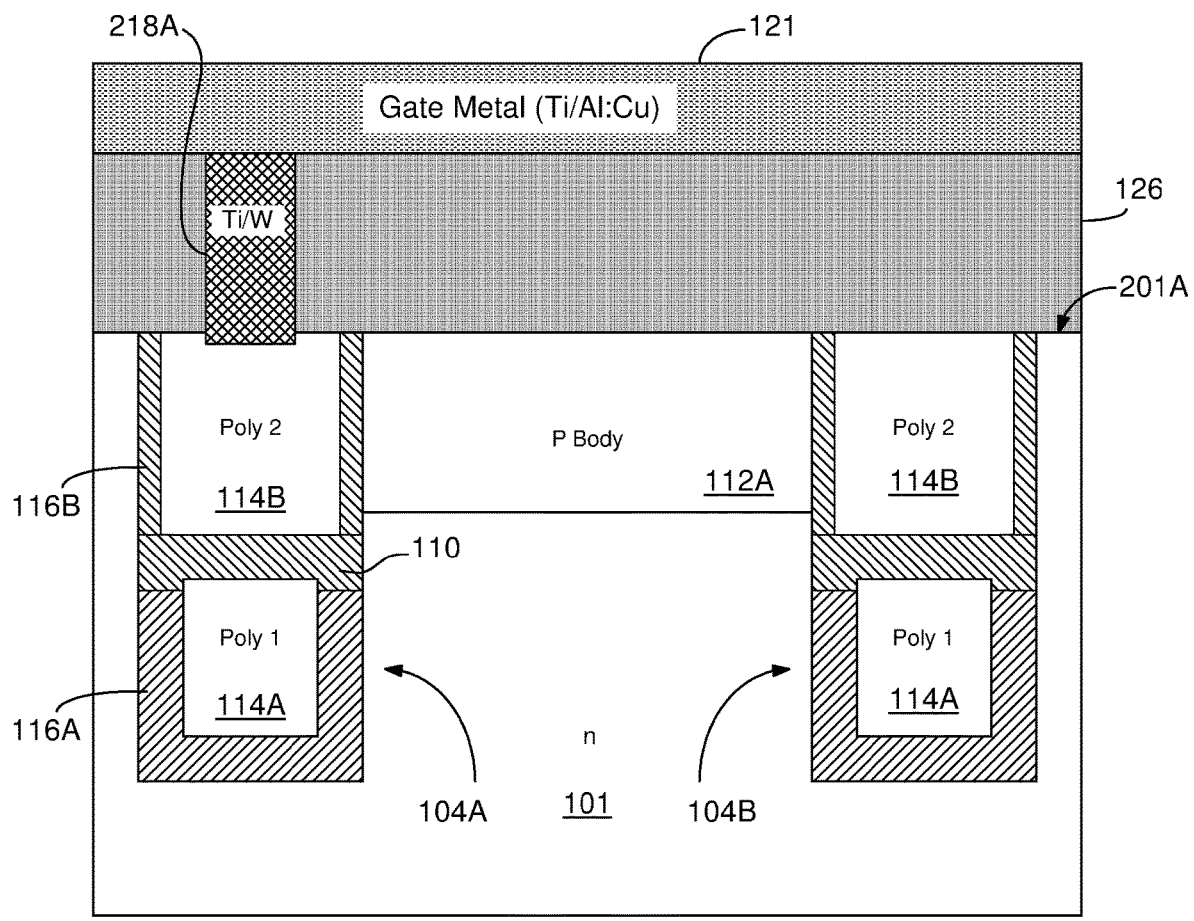
Figure 2O:
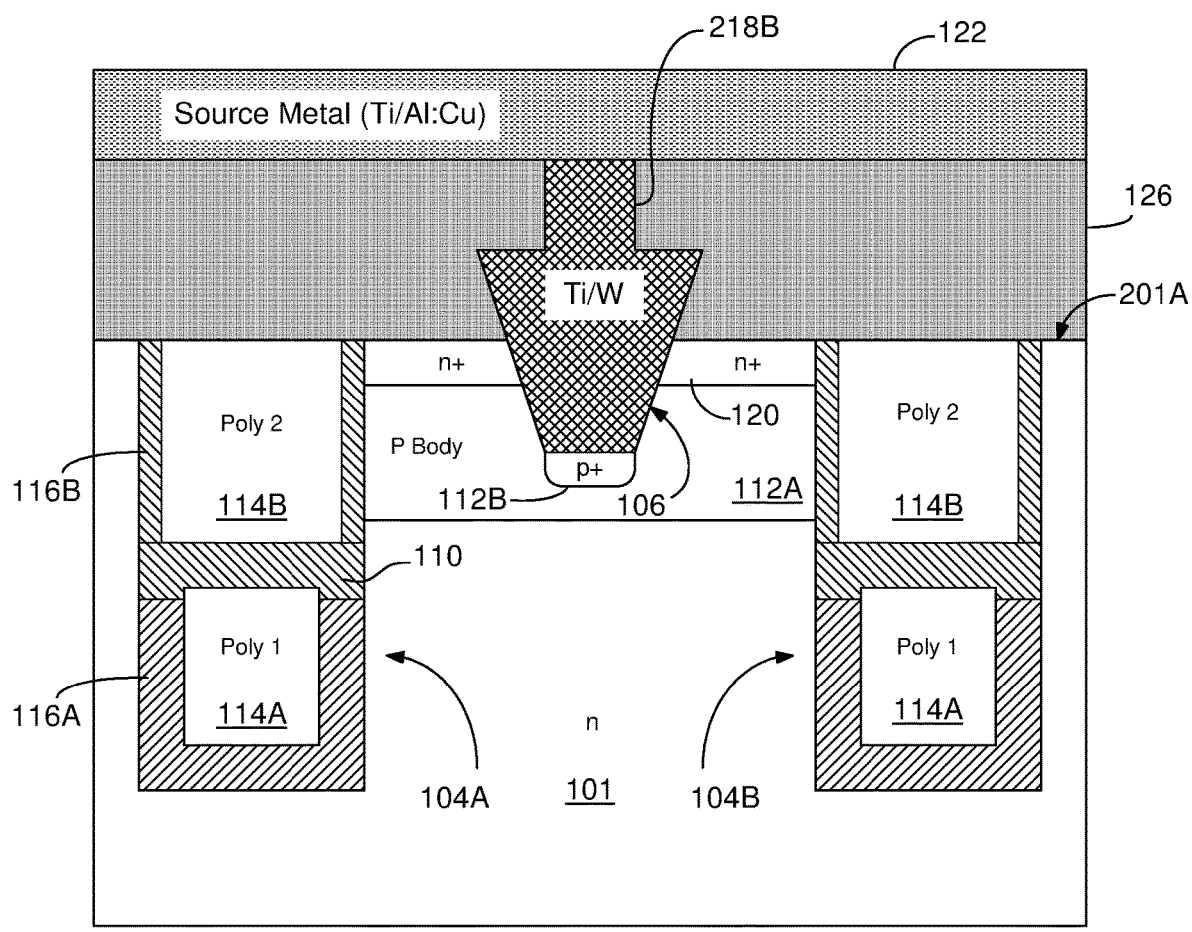
Figure 2P:
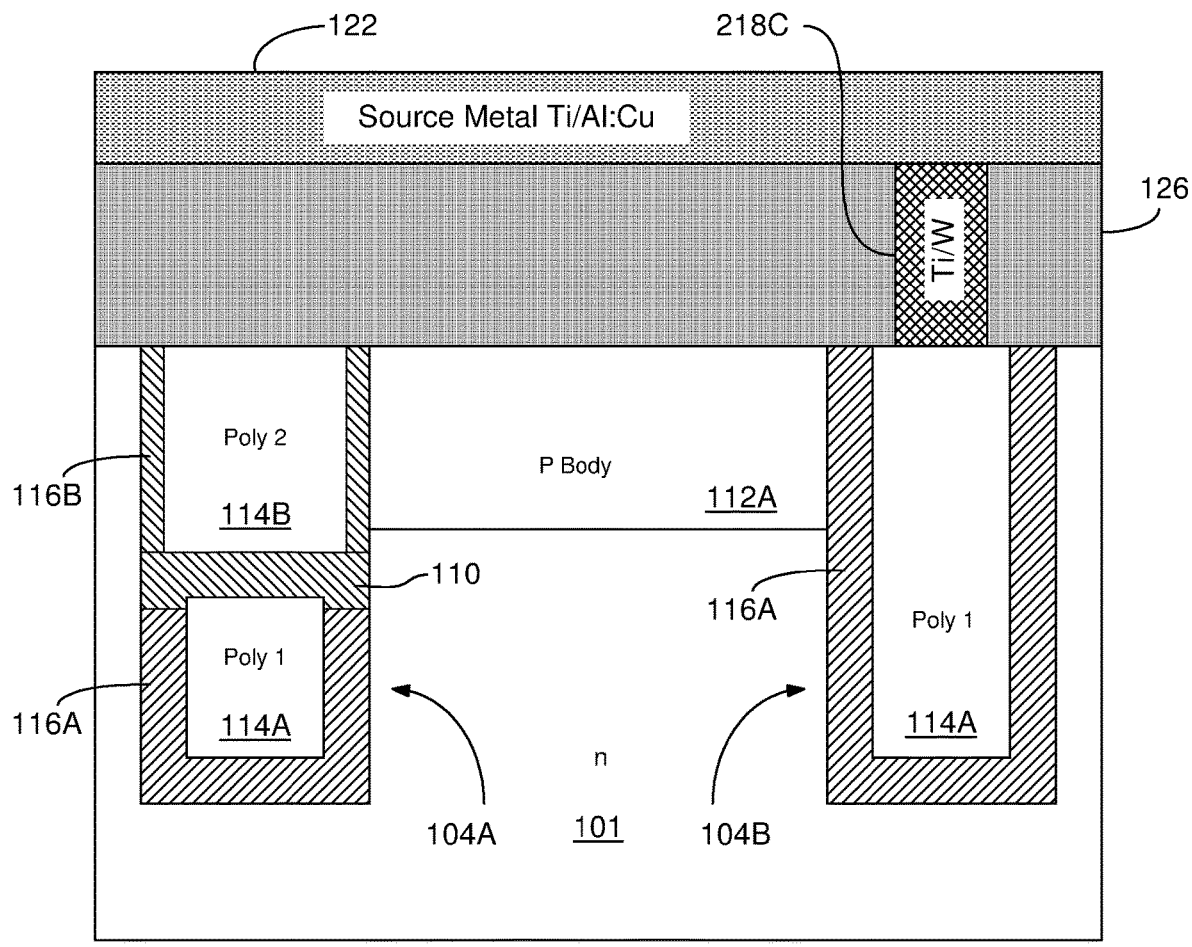

FIGS. 2N, 2O and 2P show the alternative contact approaches using contact plugs 218A, 218B and 218C, which are Ti/TiN and W plugs, after the metalization: the gate metal 121 to the second poly silicon layer 114B (FIG. 2N); the source metal 122 to the p body region 112A and the p+ region 112B (FIG. 2O); and the source metal 122 to the first poly silicon layer 114A (FIG. 2P, where the first poly silicon is etched back along with the mesa).

Figure 3A:
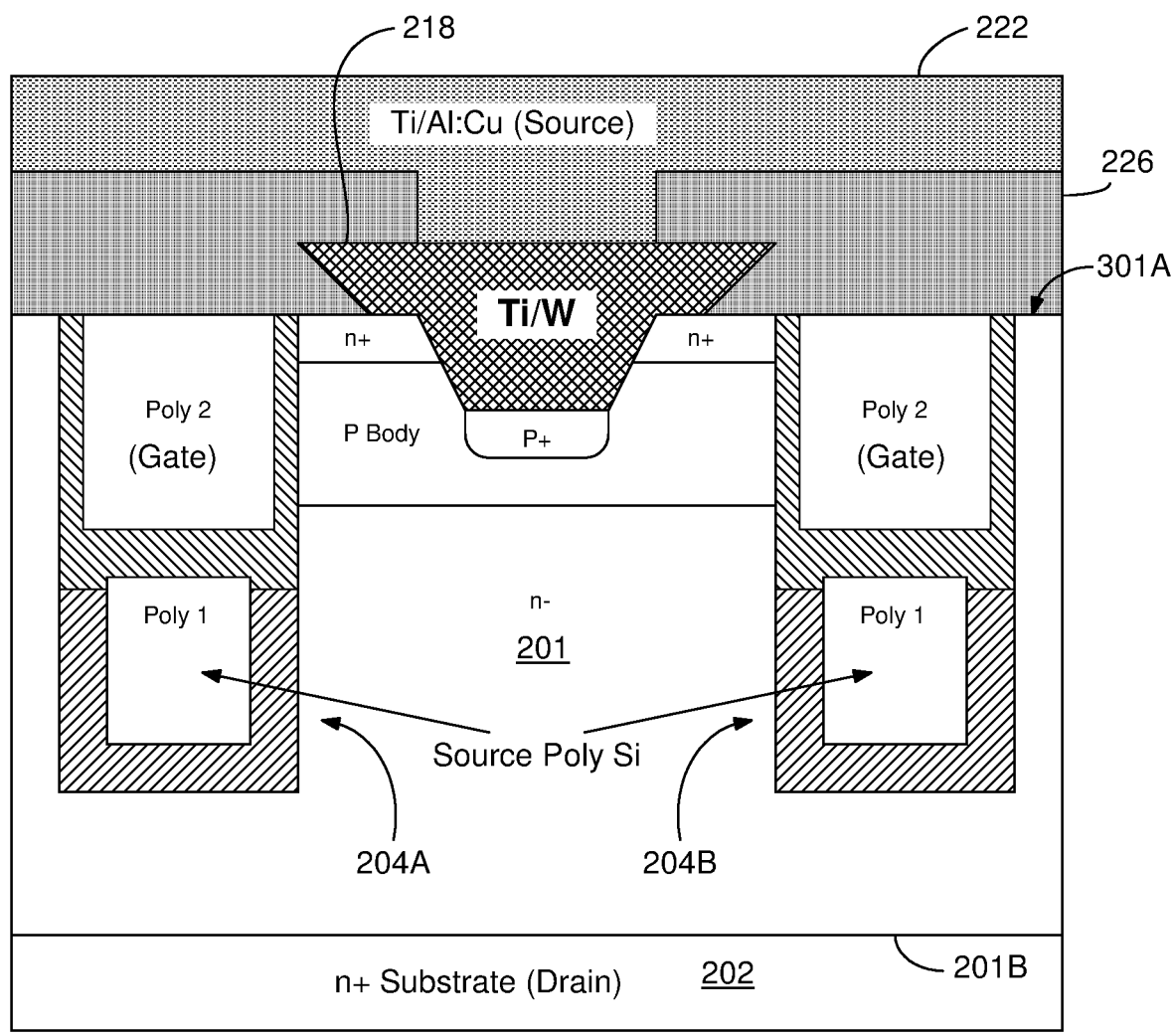
FIGS. 3A and 3B are schematic illustrations of power MOSFET device structures.
Figure 3B:
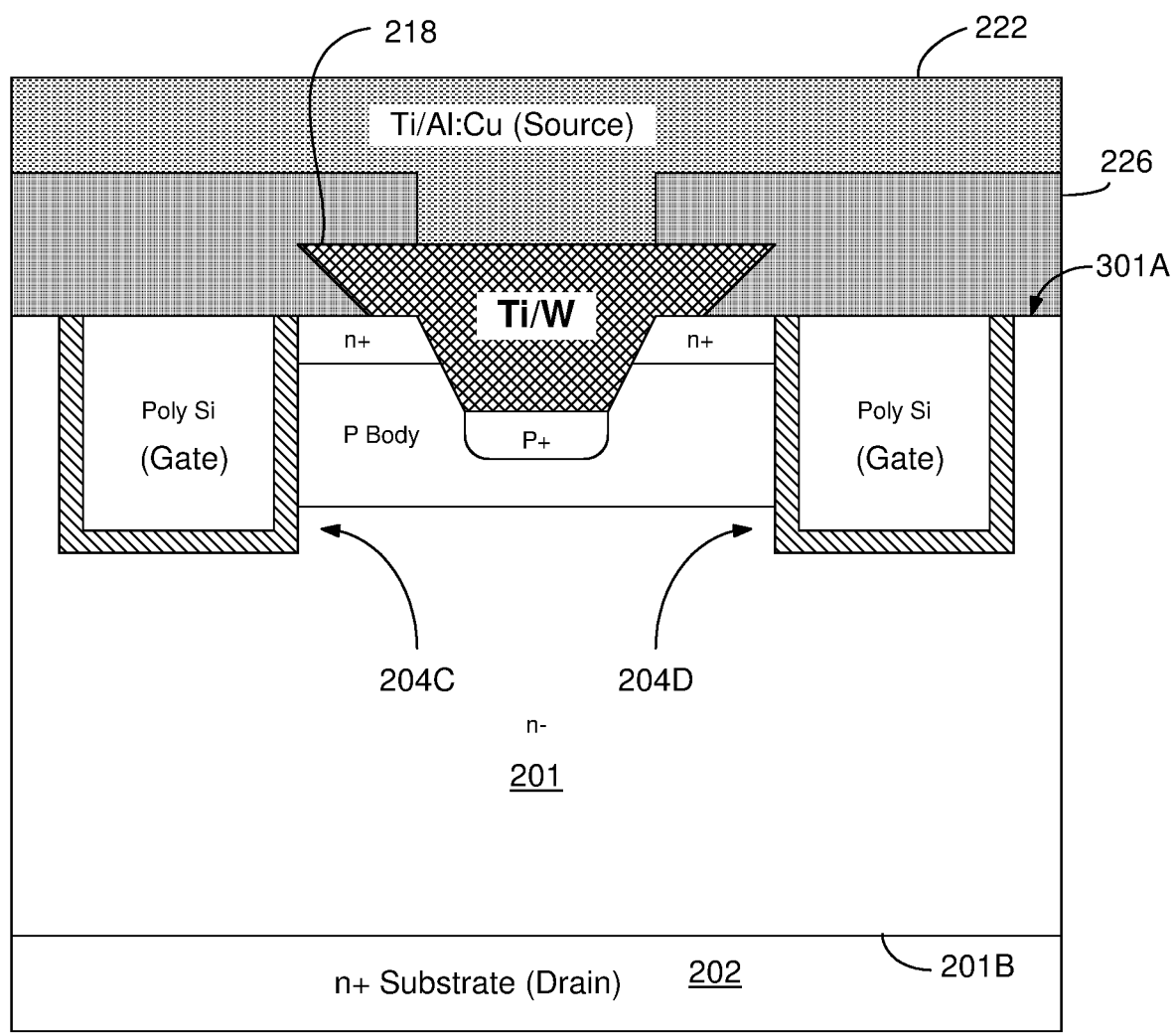

FIGS. 3A-3B show exemplary self-aligned MOSFET (metal oxide field effect transistor) device structures 200, having n+ substrate 202 as drain under the silicon layer 201 (having the lower mesa surface 301A, as the top surface, and a back surface 201B), formed using the process described above, notably forming the oxide plugs, forming the lower mesa surface, forming an oxide layer on top of the oxide plugs and the lower mesa surface, forming the oxide spacers, forming the contact trench and the following other process steps as described above. FIG. 3A shows an exemplary shielded gate trench MOSFET device and FIG. 3B shows an exemplary trench MOSFET device.

Figure 4A:
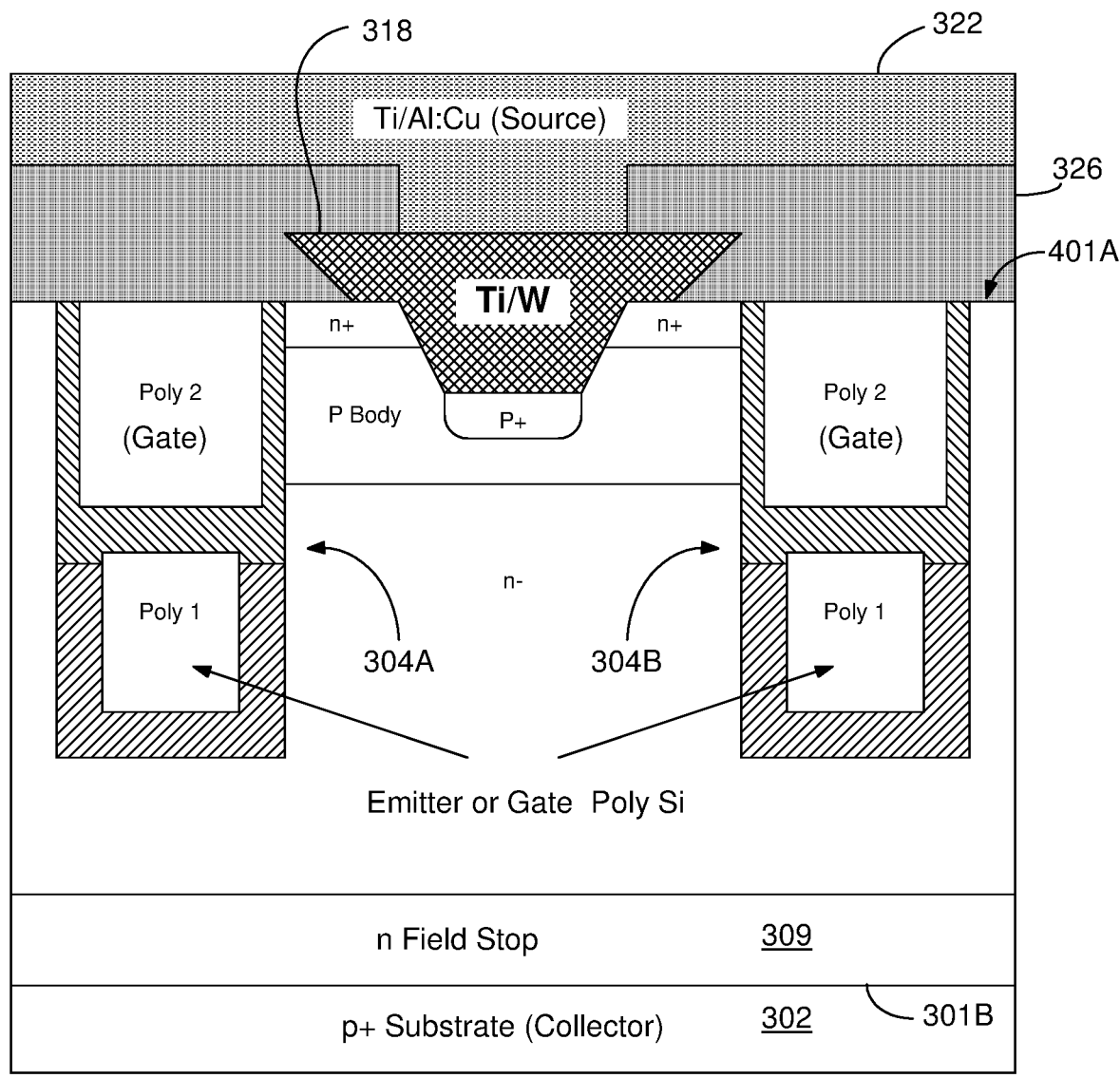
FIGS. 4A and 4B are schematic illustrations of IGBT device structures.
Figure 4B:
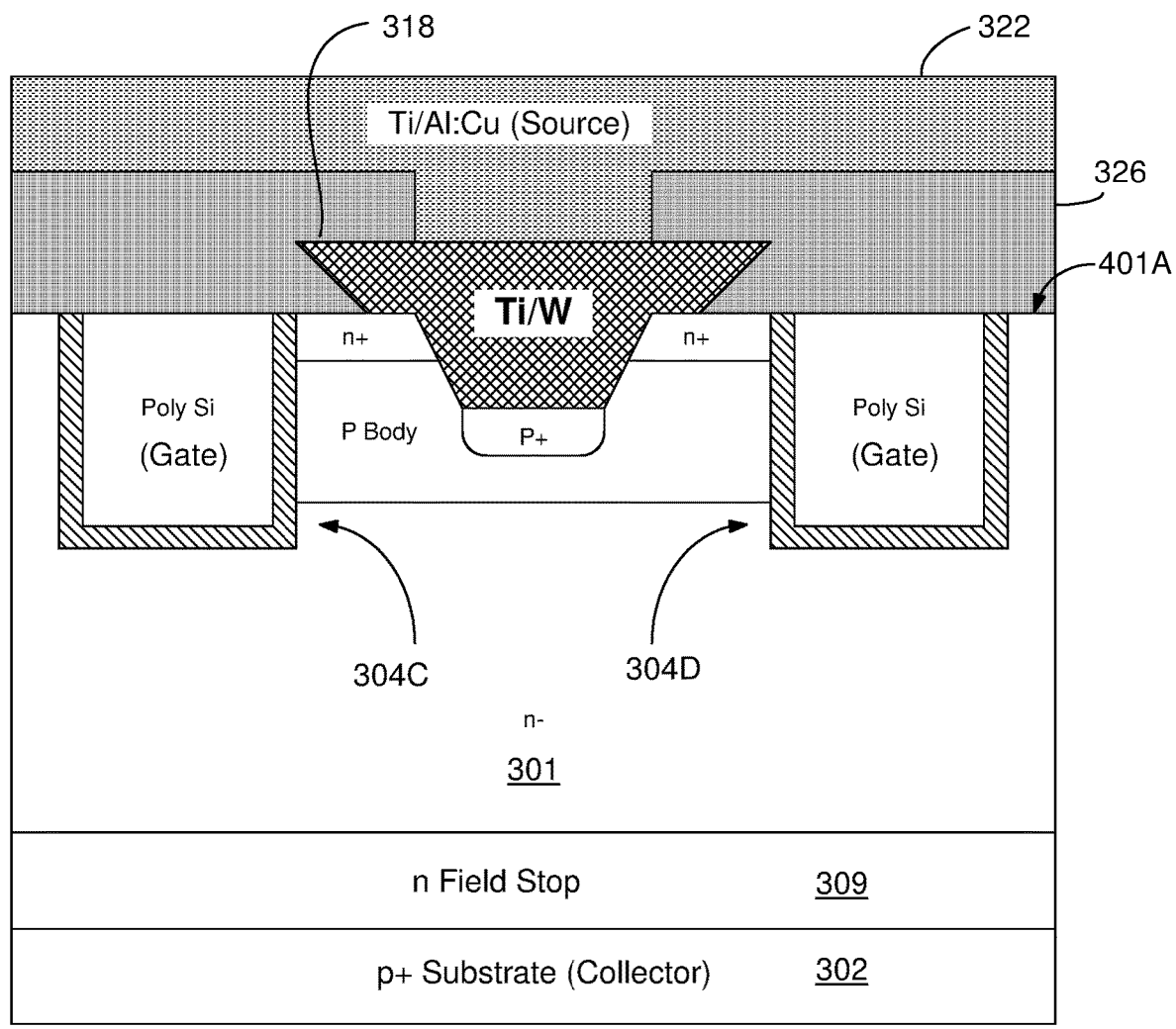

FIGS. 4A-4B show exemplary self-aligned IGBT (insulated gate bipolar transistor) device structures 300, having n+ substrate 302 as collector and a n field stop layer 304 or n field stop region 304 between the silicon layer 301 (having the lower mesa surface 401A as the top surface and a back surface 301B) and the n+ substrate 302. The self-aligned IGBT device structures are formed using generally the process steps described above, notably forming the oxide plugs, forming the lower mesa surface, forming an oxide layer on top of the oxide plugs, the lower mesa surface, forming the oxide spacers, forming the contact trench and the following other process steps as described above. FIG. 4A shows an exemplary shielded gate trench IGBT device and FIG. 4B shows an exemplary trench IGBT device.

Although aspects and advantages of the present invention are described herein with respect to certain embodiments, modifications of the embodiments will be apparent to those skilled in the art. This technique of forming self-aligned contact is applicable to produce both MOSFET, as well as Insulated Gate Bipolar Transistors. It can be used with all semiconductor materials used for Power Semiconductor Devices such as silicon, silicon carbide and GaN, even though detailed examples are given here using silicon material; therefore, the scope of the present invention should not be limited to the foregoing discussion but should be defined by the appended claims.

We claim:

1. A method of forming shielded gate trench MOSFET devices, including:
   providing a silicon layer having n type conductivity layer overlying a semiconductor substrate;
   forming, on a mesa surface of the silicon layer, a plurality of gate trenches in an active region, the gate trenches extending orthogonally from the mesa surface toward the semiconductor substrate;
   forming in each gate trench a gate trench stack;
   forming oxide plugs on top surface of a doped poly silicon layer, which is a gate polysilicon layer, inside the gate trench;
   etching down the mesa surface to make the mesa surface substantially coplanar with the top surface of the gate polysilicon layer;
   forming p body and n+ source regions of the MOSFET in the etched down mesa surface;
   forming silicon dioxide spacers defining a self-aligned p+ contact trench; and
   filling the self-aligned p+ contact trench with a metal plug.

2. The method of claim 1, wherein substrate is n type with doping concentration ranging from 1E19 to 1E20 $cm^{-3}$ forming a shielded gate power MOSFET.

3. The method of claim 1, further including an additional n layer with doping concentration ranging from 5E15 to 2E17 $cm^{-3}$ overlying a p type substrate with doping concentration ranging from 1E17 to 5E19 $cm^{-3}$ forming a shielded gate insulated gate bipolar transistor (IGBT).

4. The method of claim 1, wherein
   forming in each gate trench a gate trench stack including:
      growing a gate oxide layer and forming the gate poly silicon layer on the gate oxide layer;
      etching back top surface of the gate poly silicon layer to lower the top surface, within the gate trench, below the mesa surface.

5. The method of claim 1 wherein
   forming in each gate trench a gate trench stack including:
   forming a shield layer lining side walls and bottom wall of each gate trench, wherein the shield layer is silicon oxide;
   forming a first doped poly silicon layer on a portion of the shield layer lining the bottom wall and lower portions of the side walls of the gate trench;
   removing upper portions of the shield layer to expose upper portions of the side walls;
   forming an Inter Poly Oxide (IPO) layer on the first doped poly silicon layer by filling the trench with dielectric, planarizing and etching back to predefined thickness;
   growing gate oxide, depositing and planarizing a second doped poly silicon, which is the gate poly silicon layer; and
   etching back the gate poly silicon layer below the mesa surface.

6. The method of claim 5, wherein the gate poly silicon layer recessed about 0.2 to 0.5 microns from the mesa surface of the silicon layer.

7. The method of claim 1, further including:
   forming body contact trenches via a silicon etching by using oxide plugs as a mask;
   forming p+ body regions by low energy ion implantation of B or $BF_2$ ions through the body contact trenches; and
   forming a top metal layer for source electrodes and gate electrodes.

8. The method of claim 1, wherein etching down the mesa surface includes etching down the mesa surface about 0.2 to 0.5 micron.

9. The method of claim 1, wherein the n+ source is formed at substantially the same level of top surface of the gate poly silicon layer.

10. The method of claim 1, wherein the n+ source is formed below the level of top surface of the gate poly silicon layer.

11. The method of claim 1, wherein the n+ source is formed above the level of top surface of the gate poly silicon layer.

12. The method of claim 1, wherein
   forming in each gate trench a gate trench stack including:
   forming a shield layer lining side walls and bottom wall of each gate trench, wherein shield layer is silicon oxide;
   forming a first doped poly silicon layer on a portion of the shield layer lining the bottom wall and lower portions of the side walls of the gate trench;
   removing upper portions of the shield layer to expose upper portions of the side walls;
   forming an inter poly oxide (IPO) layer including a thermally grown oxide over first poly silicon, wherein forming of the IPO layer results in forming silicon oxide layer on upper portions of the side walls;
   depositing a high density plasma (HDP) oxide layer on the oxide layer to further thicken IPO layer, wherein a thickness ratio of the HDP oxide layer on the side walls to on the IPO layer is about 1/5;
   removing the HDP oxide and the silicon oxide from the trench side walls using wet etching while retaining the HDP oxide over the IPO layer and major portions of the HDP oxide layer on the mesa surface;
   growing a gate oxide layer on the upper portions of the side walls and forming a second doped poly silicon layer, which is the gate poly silicon layer, on the gate oxide layer and the IPO layer, filling the gate trench; and
   recessing the gate poly silicon about 0.2-0.5 micron below the mesa surface.

13. The method of claim 1, wherein forming in each gate trench a gate trench stack includes:
   forming a shield layer lining side walls and bottom wall of each gate trench, wherein the shield layer is silicon oxide;
   forming a first doped poly silicon layer on a portion of the shield layer lining the bottom wall and lower portions of the side walls of the gate trench;
   forming an inter poly oxide (IPO) layer, on top of the first doped poly silicon layer, having a predefined thickness;
   growing a gate oxide and forming the gate poly silicon layer on the IPO layer; and
   etching back top surface of the gate poly silicon layer to lower the top surface, within the gate trench and below the mesa surface.

14. The method of claim 13 further including forming the metal plug contacting n+ source and the p+ base by deposition of Ti and W and CMP of W;

forming an Interlayer Dielectric by deposition of oxide and BPSG or PSG; and forming first doped poly silicon layer contact window, gate poly silicon layer contact window, and forming gate electrode by metallization.

\* \* \* \* \*